United States Patent
Yi et al.

(10) Patent No.: US 9,735,022 B2
(45) Date of Patent: Aug. 15, 2017

(54) ARRAYS OF LONG NANOSTRUCTURES IN SEMICONDUCTOR MATERIALS AND METHODS THEREOF

(71) Applicant: Alphabet Energy, Inc., Hayward, CA (US)

(72) Inventors: Mingqiang Yi, San Pablo, CA (US); Matthew L. Scullin, San Francisco, CA (US); Gabriel Matus, San Francisco, CA (US); Dawn L. Hilken, Pleasant Hill, CA (US); Chii Guang Lee, Fremont, CA (US); Sylvain Muckenhirn, Santa Barbara, CA (US)

(73) Assignee: ALPHABET ENERGY, INC., Hayward, CA (US)

(*) Notice: Subject to any disclaimer, the term of this patent is extended or adjusted under 35 U.S.C. 154(b) by 148 days.

(21) Appl. No.: 14/567,793

(22) Filed: Dec. 11, 2014

(65) Prior Publication Data
US 2015/0093904 A1    Apr. 2, 2015

Related U.S. Application Data

(62) Division of application No. 13/299,179, filed on Nov. 17, 2011, now Pat. No. 9,240,328.
(Continued)

(51) Int. Cl.
*H01L 21/308* (2006.01)
*B82Y 30/00* (2011.01)
(Continued)

(52) U.S. Cl.
CPC .......... *H01L 21/3086* (2013.01); *B82Y 10/00* (2013.01); *B82Y 30/00* (2013.01);
(Continued)

(58) Field of Classification Search
CPC .............................. B82Y 40/00; B82Y 30/00
See application file for complete search history.

(56) References Cited

U.S. PATENT DOCUMENTS

| | | | |
|---|---|---|---|
| 2,588,254 | A | 3/1952 | Lark-Horovitz et al. |
| 3,441,812 | A | 4/1969 | De Bucs et al. |

(Continued)

FOREIGN PATENT DOCUMENTS

| | | |
|---|---|---|
| CN | 1352468 | 6/2002 |
| CN | 1957483 | 5/2007 |

(Continued)

OTHER PUBLICATIONS

European Patent Office, Extended European Search Report for EP Application No. 12790253.4, mailed Sep. 21, 2015.
(Continued)

*Primary Examiner* — Seahvosh Nikmanesh
(74) *Attorney, Agent, or Firm* — K&L Gates LLP

(57) ABSTRACT

An array of nanowires and method thereof. The array of nanowires includes a plurality of nanowires. The plurality of nanowires includes a plurality of first ends and a plurality of second ends respectively. For each of the plurality of nanowires, a corresponding first end selected from the plurality of first ends and a corresponding second end selected from the plurality of second ends are separated by a distance of at least 200 μm. All nanowires of the plurality of nanowires are substantially parallel to each other.

20 Claims, 17 Drawing Sheets

Related U.S. Application Data

(60) Provisional application No. 61/415,577, filed on Nov. 19, 2010.

(51) Int. Cl.

| | | |
|---|---|---|
| *B82Y 40/00* | (2011.01) | |
| *B82Y 10/00* | (2011.01) | |
| *H01L 31/0352* | (2006.01) | |
| *H01L 27/16* | (2006.01) | |
| *H01L 29/06* | (2006.01) | |

(52) U.S. Cl.
CPC .......... *B82Y 40/00* (2013.01); *H01L 21/3085* (2013.01); *H01L 27/16* (2013.01); *H01L 31/035227* (2013.01); *H01L 21/3081* (2013.01); *H01L 29/0676* (2013.01); *Y10T 428/24802* (2015.01); *Y10T 428/249924* (2015.04); *Y10T 428/2913* (2015.01)

(56) References Cited

U.S. PATENT DOCUMENTS

| | | |
|---|---|---|
| 4,251,286 A | 2/1981 | Barnett |
| 4,493,939 A | 1/1985 | Blaske et al. |
| 4,842,699 A | 6/1989 | Hua et al. |
| 5,391,914 A | 2/1995 | Sullivan et al. |
| 5,824,561 A | 10/1998 | Kishi et al. |
| 5,837,929 A | 11/1998 | Adelman |
| 5,950,067 A | 9/1999 | Maegawa et al. |
| 6,300,150 B1 | 10/2001 | Venkatasubramanian |
| 6,843,902 B1 | 1/2005 | Penner et al. |
| 6,882,051 B2 | 4/2005 | Majumdar et al. |
| 6,894,215 B2 | 5/2005 | Akiba |
| 6,996,147 B2 | 2/2006 | Majumdar et al. |
| 7,267,859 B1 | 9/2007 | Rabin et al. |
| 7,361,313 B2 | 4/2008 | Chan et al. |
| 7,569,202 B2 | 8/2009 | Farrell et al. |
| 7,605,327 B2 | 10/2009 | Roscheisen et al. |
| 7,713,778 B2 | 5/2010 | Li et al. |
| 7,820,292 B2 | 10/2010 | Shcherbakov et al. |
| 8,044,294 B2 | 10/2011 | Park et al. |
| 8,206,780 B2 | 6/2012 | Li et al. |
| 8,729,381 B2 | 5/2014 | Yang et al. |
| 8,736,011 B2 | 5/2014 | Yi et al. |
| 9,051,175 B2 | 6/2015 | Matus et al. |
| 9,082,930 B1 | 7/2015 | Wacker et al. |
| 2002/0175408 A1 | 11/2002 | Majumdar et al. |
| 2003/0041892 A1 | 3/2003 | Fleurial et al. |
| 2003/0099279 A1 | 5/2003 | Venkatasubramanian et al. |
| 2003/0184188 A1 | 10/2003 | Kucherov et al. |
| 2003/0189202 A1 | 10/2003 | Li et al. |
| 2004/0000333 A1 | 1/2004 | Chen et al. |
| 2004/0042181 A1 | 3/2004 | Nagasaki |
| 2004/0106203 A1 | 6/2004 | Stasiak et al. |
| 2004/0157354 A1 | 8/2004 | Kuriyama et al. |
| 2004/0161369 A1 | 8/2004 | Chan et al. |
| 2004/0251539 A1 | 12/2004 | Faris et al. |
| 2004/0261830 A1 | 12/2004 | Sharp et al. |
| 2005/0045702 A1 | 3/2005 | Freeman et al. |
| 2005/0060884 A1 | 3/2005 | Okamura |
| 2005/0064185 A1 | 3/2005 | Buretea et al. |
| 2005/0110064 A1 | 5/2005 | Duan et al. |
| 2005/0112872 A1 | 5/2005 | Okamura |
| 2005/0224790 A1 | 10/2005 | Jin et al. |
| 2005/0241690 A1 | 11/2005 | Tajima et al. |
| 2006/0000502 A1 | 1/2006 | Fiorini et al. |
| 2006/0076046 A1 | 4/2006 | Ghoshal et al. |
| 2006/0118158 A1 | 6/2006 | Zhang et al. |
| 2006/0118513 A1 | 6/2006 | Faure et al. |
| 2006/0151820 A1 | 7/2006 | Duan et al. |
| 2006/0157101 A1 | 7/2006 | Sakamoto et al. |
| 2006/0159916 A1 | 7/2006 | Dubrow et al. |
| 2006/0172116 A1 | 8/2006 | Den et al. |
| 2006/0233692 A1 | 10/2006 | Scaringe et al. |
| 2006/0251561 A1 | 11/2006 | Farrell et al. |
| 2006/0254501 A1 | 11/2006 | Wang et al. |
| 2006/0266402 A1 | 11/2006 | Zhang et al. |
| 2007/0025658 A1 | 2/2007 | Fukai et al. |
| 2007/0128773 A1 | 6/2007 | Baskaran |
| 2007/0131269 A1 | 6/2007 | Dutta |
| 2007/0132043 A1 | 6/2007 | Bradley et al. |
| 2007/0261730 A1 | 11/2007 | Seker et al. |
| 2008/0006843 A1 | 1/2008 | Dai et al. |
| 2008/0060695 A1 | 3/2008 | Brignone |
| 2008/0093698 A1 | 4/2008 | Tsakalakos et al. |
| 2008/0121263 A1 | 5/2008 | Schutte et al. |
| 2008/0142066 A1 | 6/2008 | Plissonnier et al. |
| 2008/0149914 A1 | 6/2008 | Samuelson et al. |
| 2008/0173344 A1 | 7/2008 | Zhang et al. |
| 2008/0178920 A1 | 7/2008 | Ullo |
| 2008/0178921 A1 | 7/2008 | Ye |
| 2008/0230802 A1 | 9/2008 | Bakkers et al. |
| 2008/0268233 A1 | 10/2008 | Lawin et al. |
| 2008/0299381 A1 | 12/2008 | Zhang et al. |
| 2008/0308140 A1 | 12/2008 | Nakamura |
| 2009/0004086 A1 | 1/2009 | Kuhling et al. |
| 2009/0020148 A1 | 1/2009 | Boukai et al. |
| 2009/0096109 A1 | 4/2009 | Iwasaki |
| 2009/0117741 A1 | 5/2009 | Heath et al. |
| 2009/0140145 A1 | 6/2009 | Ouvrier-Buffet et al. |
| 2009/0174038 A1 | 7/2009 | Wang |
| 2009/0214848 A1 | 8/2009 | Sands |
| 2009/0236317 A1 | 9/2009 | Yost et al. |
| 2009/0301389 A1* | 12/2009 | Samuelson ............ B82Y 30/00 117/88 |
| 2010/0068871 A1 | 3/2010 | Tian et al. |
| 2010/0072461 A1 | 3/2010 | Hannebauer |
| 2010/0078055 A1 | 4/2010 | Vidu et al. |
| 2010/0147350 A1 | 6/2010 | Chou |
| 2010/0147371 A1 | 6/2010 | Cho |
| 2010/0162728 A1 | 7/2010 | Lee |
| 2010/0233518 A1 | 9/2010 | Kwon et al. |
| 2010/0236596 A1 | 9/2010 | Lee et al. |
| 2010/0261013 A1 | 10/2010 | Duan et al. |
| 2010/0272993 A1 | 10/2010 | Volinsky et al. |
| 2010/0319759 A1 | 12/2010 | Fisher et al. |
| 2011/0000708 A1 | 1/2011 | Nakai et al. |
| 2011/0059568 A1 | 3/2011 | Chao et al. |
| 2011/0065223 A1 | 3/2011 | Hannebauer |
| 2011/0114145 A1 | 5/2011 | Yang et al. |
| 2011/0114146 A1 | 5/2011 | Scullin |
| 2011/0174069 A1* | 7/2011 | Cornelius ............ B01J 19/0093 73/204.23 |
| 2011/0233512 A1 | 9/2011 | Yang et al. |
| 2011/0266521 A1 | 11/2011 | Ferrari et al. |
| 2011/0304004 A1 | 12/2011 | Park |
| 2012/0037591 A1 | 2/2012 | Tringe et al. |
| 2012/0040512 A1 | 2/2012 | Li et al. |
| 2012/0049315 A1 | 3/2012 | Kim et al. |
| 2012/0126449 A1 | 5/2012 | Hart et al. |
| 2012/0152295 A1 | 6/2012 | Matus et al. |
| 2012/0247527 A1 | 10/2012 | Scullin et al. |
| 2012/0282435 A1 | 11/2012 | Yang et al. |
| 2012/0295074 A1 | 11/2012 | Yi et al. |
| 2013/0000688 A1 | 1/2013 | Cho et al. |
| 2013/0019918 A1 | 1/2013 | Boukai et al. |
| 2013/0037070 A1 | 2/2013 | Narducci et al. |
| 2013/0042899 A1 | 2/2013 | Wirtz et al. |
| 2013/0069194 A1 | 3/2013 | Marinescu et al. |
| 2013/0081662 A1 | 4/2013 | Dibra |
| 2013/0161834 A1 | 6/2013 | Pan |
| 2013/0175654 A1 | 7/2013 | Muckenhirn et al. |
| 2013/0186445 A1 | 7/2013 | Lorimer et al. |
| 2013/0187130 A1 | 7/2013 | Matus et al. |
| 2013/0241026 A1 | 9/2013 | Or-Bach et al. |
| 2013/0267046 A1 | 10/2013 | Or-Bach et al. |
| 2014/0024163 A1 | 1/2014 | Aguirre et al. |
| 2014/0116491 A1 | 5/2014 | Reifenberg et al. |
| 2014/0182644 A1 | 7/2014 | Aguirre et al. |

(56) References Cited

U.S. PATENT DOCUMENTS

| | | | |
|---|---|---|---|
| 2014/0193982 | A1 | 7/2014 | Yi et al. |
| 2014/0318593 | A1 | 10/2014 | Venkatasubramanian et al. |
| 2014/0329389 | A1 | 11/2014 | Matus et al. |

FOREIGN PATENT DOCUMENTS

| | | |
|---|---|---|
| CN | 101009214 | 8/2007 |
| CN | 101156255 | 4/2008 |
| CN | 101836285 | 9/2010 |
| EP | 0687020 | 12/1995 |
| EP | 1426756 | 6/2004 |
| JP | 2004-532133 | 10/2004 |
| JP | 2006-332188 | 12/2006 |
| JP | 5524839 | 4/2014 |
| RU | 2296055 | 11/2006 |
| WO | WO 00/08693 | 2/2000 |
| WO | WO 02/080280 | 10/2002 |
| WO | WO 2006/062582 | 6/2006 |
| WO | WO 2009/014985 | 1/2009 |
| WO | WO 2009/026466 | 2/2009 |
| WO | WO 2009/125317 | 10/2009 |
| WO | WO 2010/004550 | 1/2010 |
| WO | WO 2010/018893 | 2/2010 |
| WO | WO 2015/021467 | 2/2015 |

OTHER PUBLICATIONS

United States Patent and Trademark Office, Office Action issued in U.S. Appl. No. 13/430,558, mailed Jun. 29, 2015.
United States Patent and Trademark Office, Office Action issued in U.S. Appl. No. 12/943,134, mailed Sep. 25, 2015.
United States Patent and Trademark Office, Notice of Allowance issued in U.S. Appl. No. 13/299,179, mailed Sep. 23, 2015.
United States Patent and Trademark Office, Office Action issued in U.S. Appl. No. 13/331,768, mailed Oct. 6, 2015.
Chinese Patent Office, Office Action in CN Application No. 201180065569.0, mailed Aug. 3, 2015.
Patent Cooperation Treaty, International Search Report for application PCT/US2015/025075, mailed Aug. 4, 2015.
Patent Cooperation Treaty, Written Opinion of the International Searching Authority for application PCT/US2015/025075, mailed Aug. 4, 2015.
United States Patent and Trademark Office, Notice of Allowance issued in U.S. Appl. No. 14/333,197, mailed Aug. 18, 2015.
United States Patent and Trademark Office, Notice of Allowance issued in U.S. Appl. No. 13/947,400, mailed Jul. 6, 2015.
United States Patent and Trademark Office, Notice of Allowance issued in U.S. Appl. No. 14/203,360, mailed Jul. 21, 2015.
United States Patent and Trademark Office, Office Action issued in U.S. Appl. No. 14/226,569, mailed Jun. 8, 2015.
United States Patent and Trademark Office, Office Action issued in U.S. Appl. No. 13/760,977, mailed Jun. 17, 2015.
Masetti et al., "Modeling of Carrier Mobility Against Carrier Concentration in Arsenic-, Phosphorus-, and Boron-Doped Silicon," IEEE Transactions on Electron Device, 30(7):764-769 (1983).
European Patent Office, Extended European Search Report for EP Application No. 10830715.8, mailed Jun. 10, 2014.
United States Patent and Trademark Office, Office Action issued in U.S. Appl. No. 13/430,558, mailed Jan. 30, 2015.
United States Patent and Trademark Office, Notice of Allowance issued in U.S. Appl. No. 13/786,090, mailed Feb. 9, 2015.
United States Patent and Trademark Office, Office Action issued in U.S. Appl. No. 13/299,179, mailed Feb. 26, 2015.
United States Patent and Trademark Office, Notice of Allowance issued in U.S. Appl. No. 14/059,362, mailed Mar. 6, 2015.
United States Patent and Trademark Office, Notice of Allowance issued in U.S. Appl. No. 13/947,400, mailed Mar. 24, 2015.
United States Patent and Trademark Office, Corrected Notice of Allowability issued in U.S. Appl. No. 13/786,090, mailed Mar. 3, 2015.

Benecke et al., "MEMS Applications of Porous Silicon." Proc. SPIE 4592, Device and Process Technologies for MEMS and Microelectronics II, 76: doi:10.1117/12.449009. 12 pages (Nov. 21, 2011).
Bogush et al., "Preparation of monodisperse silica particles: Control of size and mass fraction," Journal of Non-Crystalline Solids 104: 95-106 (1988).
Chen et al., "Wafer-scale synthesis of single-crystal zigzag silicon nanowire arrays with controlled turning angles." Nano Lett. 10: 864-868 (2010).
Chiappini et al., "Biodegradable porous silicon barcode nanowires with defined geometry." Adv. Funct. Mater. 20: 2231-2239 (2010).
Huang et al., "Metal-assisted chemical etching of silicon: A review," Adv. Mater. 23: 285-308 (2011).
Huang et al., "Oxidation rate effect on the direction of metal-assisted chemical and electrochemical etching of silicon." J. Phys. Chem. C 114: 10683-10690 (2010).
Huang et al., "Synthesis of uniform, spherical sub-100 nm silica particles using a conceptual modification of the classic LaMer model." Colloids and Surfaces A: Physicochem. Eng. Aspects 360: 175-183 (2010).
Kim et al., "Curved silicon nanowires with ribbon-like cross sections by metal-assisted chemical etching," ACS Nano 5(6): 5242-5248 (2011).
Lee et al., "Scalable nanopillar arrays with layer-by-layer patterned overt and covert images," Adv. Mater. 26: 6119-6124 (2014).
Peng et al., "Fabrication of single-crystalline silicon nanowires by scratching a silicon surface with catalytic metal particles," Adv. Funct. Mater. 16: 387-394 (2006).
Ryckman et al., "Direct imprinting of porous substrates: A rapid and low-cost approach for patterning porous nanomaterials." Nano Lett.: dx.doi/10.1021/n11028073. 6 pages (2010).
Sailor, "Fundamentals of Porous Silicon Preparation." Chapter 1, pp. 1-42, Porous Silicon in Practice: Preparation, Characterization and Applications, First Edition. Wiley-VCH Verlag GmbH & Co. KGaA (2012).
Stober et al., "Controlled growth of monodisperse silica spheres in the micron size range," Journal of Colloid and Interface Science 26: 62-69 (1968).
Stewart et al., "Nanostructured Plasmonic Sensors," Chem. Rev. 108:494-521 (2008).
Chinese Patent Office, Office Action issued in Application No. 201180066221.3 mailed May 5, 2015.
United States Patent and Trademark Office, Office Action issued in U.S. Appl. No. 13/364,176, mailed Apr. 29, 2015.
United States Patent and Trademark Office, Notice of Allowance issued in U.S. Appl. No. 14/333,197. mailed May 1, 2015.
Asheghi et al., "Phonon-Boundary Scattering in Thin Silicon Layers," *Appl. Phys. Lett.*, 71(13) (1997), 1798-1800.
Asheghi et al., "Temperature-Dependent Thermal Conductivity of Single Crystal Silicon Layers in SOI Substrates," *J. Heat Transf.*, 120 (1998), pp. 30-36.
Bell, "Cooling, heating, generating power, and recovering waste heat with thermoelectric systems," Science, vol. 321, pp. 1457-1461, Sep. 12, 2008.
Ben-Chorin et al., "Hopping transport on a fractal: ac conductivity of porous silicon," Physical Review B, vol. 51, No. 4, pp. 2199-2213, Jan. 15, 1995.
Boukai et al, "Silicon nanowires as efficient thermoelectric materials," Nature, vol. 451, Jan. 10, 2000.
Brinson et al., "Thermal Conductivity and Thermoelectric Power of Heavily Doped N-Type Silicon," *J. Phys. C*, 3 (1970), pp. 483-491.
Bux et al., "Nanostructured bulk silicon as an effective thermoelectric material," Advanced Functional Materials 2009, 19, 2445-2452.
Cahill et al., "Lower limit to the thermal conductivity of disordered crystals," Physical Review B, vol. 46, No. 10, pp. 6131-6140, Sep. 1, 1992.
Cahill et al., "Thermal Conductivity of Amorphous Solids Above the Plateau," *Phys. Rev. B*, 35 (1987) pp. 4067-4073.
Chartier et al., "Metal-Assisted Chemical Etching of Silcon in HF-H$_2$O-2," *Electrochmica Acta*, 53 (2008) pp. 5509-5516.
Chen et al., "Thermal Conductance of Thin Silicon Nanowires," *Physical Review Letters*, 101 (2008) pp. 105501-1-105501-4.

(56) References Cited

OTHER PUBLICATIONS

Chen et al., "Vertically-Aligned of Sub-Millimeter Ultralong Si Nanowire Arrays and Its Reduced Phonon Thermal Conductivity," *Journal of the Electrochemical Society*, 158:5 (2011) pp. D302-D306.
Cheng et al., "Fabrication of Vertically Aligned Silicon Nanowire Arrays and Investigation on the Formation of the Nickel Silicide Nanowires," presented at the 2007 IEEE Conference on Electron Devices and Solid-State Circuit held Dec. 20-22, 2007, *IEEE Service Center*, 2007, pp. 121-124.
Chiritescu et al., "Ultralow thermal conductivity in disordered, layered $WSe_2$ crystals," Science, vol. 315, pp. 351-353, Jan. 19, 2007.
Cui, "High performance silicon nanowire field effect ansistors," Nano Letters, 2003, vol. 3, No. 2 pp. 149-152, Nov. 1, 2002.
Disalvo, F.J., "Thermoelectric Cooling and Power Generation," *Science*, 285 (1999), 703-706.
Douani et al., "Formation of a-SI:H and a-$Si_{1-x}C_x$:H Nanowires by Ag-Assisted Electroless Etching in Aqueous $HF/AgNO_3$ Solution," *Thin Solid Films*, 519 (2011) pp. 5383-5387.
Electron Microscopy Sciences, Colloidal Compounds and Conductive Adhesives, Jan. 25, 2011 (Jan. 25, 2011); Retrieved on Aug. 13, 2012 from the Internet <URL: http://web.archive.org/web/20110125172854/http://emsdiasum.com/microscopy/products/sem/colloidal.aspx>. pp. 1-16.
Engineering Toolbox, "Thermal Conductivity of Metals," Engineering ToolBox.com [retrieved online on Jan. 22, 2014], from the Internet <URL: http://www.engineeringtoolbox.com/thermal-conductivity-metals-d_858.html>, pp. 1-8.
Evanoff et al., "Synthesis and Optical Properties of Silver Nanoparticles and Arrays," *ChemPhysChem*, 6(2005) pp. 1221-1231.
Fang et al., "Silver Catalysis in the Fabrication of Silicon Nanowire Arrays," *Nanotechnology*, 17 (2006) pp. 3768-3774.
Gao et al., "Selective Growth of Si Nanowire Arrays via Galvanic Displacement Processes in Water-in-Oil Microemulsions," *J. Am. Chem. Soc.*, 117 (2005) pp. 4574-4575.
Geballe et al. "Seebeck Effect in Silicon," Phys. Rev., 98(4) (1955), pp. 940-947.
Gesele et al., "Temperature-dependent thermal conductivity of porous silicon," J. Phys. D: Appl. Phys. 30 (1997) 2911-2916, May 19, 1997.
Gielis et al., "Silver-Assisted Electroless Etching of Si Nanowires," Abstract #1971, presented Oct. 11, 2010 at the $218^{th}$ ECS Meeting (held in Las Vegas, NV, Oct. 10-15, 2010).
Haick et al., "Electrical characteristics and chemical stability of non-oxidized, methyl-terminated silicon nanowires," J. Am. Chem. Soc. 2006, 128, 8990-8991, Oct. 4, 2005.
Hao et al., "Frequency-dependent Monte Carlo simulations of phonon transport in two-dimensional porous silicon with aligned pores," Journal of Applied Physics 106, 114321 (2009), Dec. 15, 2009.
Harman et al., "Quantum Dot Superlattice Thermoelectric Materials and Evices," Science, 297 (2002), pp. 2229-2232.
Heitsch et al., *J. Am. Chem. Soc.*, 130 (2008) pp. 5436-5437.
Hochbaum et al., "Controlled Growth of Si Nanowire Arrays for Device Integration," *Nano Letters*, 5(3) (2005) pp. 457-460.
Hochbaum et al., "Enhanced Thermoelectric Performance of Rough Silicon Nanowires," Nature, 451 (2008) pp. 163-167 (with full Methods attached from on-line version of this paper at www.nature.com/nature).
Hochbaum et al., "Single Crystalline Mesoporous Silicon Nanowires," *Nano Letters*, 9(10) (2009) pp. 3550-3554.
Hsu et al., "Cubic $AgPb_mSbTe_{2+m}$: Bulk Thermoelectric Materials with High Figure of Merit," *Science*, 303 (2004), pp. 818-821.
Infineon, "Introduction to Power Dissipation and Thermal Resistance," Infineon.com [retrieved online on Jan. 22, 2014], from the Internet <URL: http://www.btipnow.com/events/ppt/Ch4%20Intro%20Power%20Diss%20Thermal%20Res.ppt>, pp. 1-67.

Ju et al., "Phonon Scattering in Silicon Films with Thickness of Order 100 nm," *Appl. Phys. Lett.*, 74(20) (1999), pp. 3005-3007.
Kim et al., "Thermal Conductivity Reduction and Thermoelectric Figure of Merit Increase by Embedding Nanoparticles in Crystalline Semiconductors," *Phys. Rev. Lett.*, 96 (2006), pp. 045901-1-045901-4.
Kim et al., "Thermal Transport Properties of Thin Films of Small Molecule Organic Semiconductors," Applied Physics Letters, 87: 241908 (2005), 3 pages.
Kolasinski, Kurt W., "Silicon Nanostructures from Electroless Electrochemical Etching," *Current Opinion in Solid State and Materials Science*, 9(1-2), (2005), pp. 73-83.
Li et al., "Thermal Conductivity of Individual Silicon Nanowires," *Appl. Phys. Lett.*, 83(14) (2003), pp. 2934-2936.
Majumdar, A., "Lower limit of thermal conductivity: diffusion versus localization," Technical Discussion, Microscale Thermophysical Engineering, 2:5-9, 1998, © 1998 Taylor & Francis 1089-3954/98.
Majumdar, A., "Thermoelectricity in Semiconductor Nanostructures," *Science*, 303 (2004), pp. 777-778.
Mathur et al., "Thermoelectric power in porous silicon," Journal of Applied Physics, vol. 83, No. 11, pp. 5855-5857, Jun. 1, 1998.
Morinaga et al., "Mechanism of Metallic Particle Growth and Metal-Induced Pitting on Si Wafer Surface in Wet Chemical Process," *J. Electrochem. Soc.*, 141(10) (1994) pp. 2834-2841.
Nahm et al., "Mechanism of Silicon Etching in $HF-KMnO_4-H_2O$ Solution," *Korean J. of Chem. Eng.*, 12(2) (1995) pp. 162-167.
Park et al., "Fabrication of highly ordered silicon oxide dots and stripes from block copolymer thin films," Advanced Materials 2008, 20, 681-685.
Parkhutik, V.P., "Oscillations of Open-Circuit Potential During Immersion Plating of Silicon in $CuSo_4$/HF Solutions," *Russian Journal of Electrochemistry*, 42(5) (2006) pp. 512-522.
Peng et al., "Aligned Single-Crystalline Si Nanowire Arrays for Photovoltaic Applications," *Small*, 1(11), (2005), pp. 1062-1067.
Peng et al., "Aligned Single-Crystalline Si Nanowire Arrays for Photovoltaic Applications," *Small*, 1(11), (2005), pp. 1062-1067, with three additional pages of "Supporting Information."
Peng et al., "Dendrite-Assisted Growth of Silicon Nanowires in Electroless Metal Deposition," *Advanced Functional Materials*, 13(2) (2003) pp. 127-132.
Peng et al., "Motility of Metal Nanoparticles in Silicon and Induced Anisotropic Silicon Etching," *Advanced Functional Materials*, 18 (2008) pp. 3026-3035.
Peng et al., "Synthesis of Large-Area Silicon Nanowire Arrays via Self-Assembling Nanoelectrochemistry," *Adv. Mater.*, 14(16) (2002) pp. 1164-1167.
Peng et al., "Uniform, Axial-Orientation Alignment of One-Dimensional Single-Crystal Silicon Nanostructure Arrays," *Angew. Chem. Int. Ed.*, 44 (2005) pp. 2737-2742.
Rokugawa et al., "An Etchant System, $Ag_2CrO_4-HF-H_2O$, for Highly Aligned Si Nanowire Fabrication," *Journal of the Electrochemical Society*, 157(8) (2010), pp. K157-K161.
Ruf et al. "Thermal Conductivity of Isotopically Enriched Silicon," *Solid State Commun.*, 115 (2000), pp. 243-247.
Rutten et al., "The Electrochemical Reduction of Nitrate in Acidic Nitrate Solutions," *Journal of Applied Electrochemistry*, 29 (1999) pp. 87-92.
Shi et al., "Measuring Thermal and Thermoelectric Properties of One-Dimensional Nanostructures Using a Microfabricated Device," *J. Heat Transf*, 125 (2003), pp. 881-888.
Sivakov et al., "Realization of Vertical and Zigzag Single Crystalline Silicon Nanowire Architectures," *J. Phys. Chem. C*, 114 (2010) pp. 3798-3803.
Snyder et al., "Complex thermoelectric materials," Nature Materials, vol. 7, pp. 105-112, Feb. 2008.
Swartz et al., "Thermal boundary resistance," Reviews of Modern Physics, vol. 61, No. 3, pp. 605-668, Jul. 1989.
Tang et al., "Holey Silicon as an Efficient Thermoelectric Material JIB-2854," abstract, Lawrence Berkeley National Laboratory, Apr. 8, 2011. Downloaded from http://lbl.gov.Tech-Transfer/techs/lbn12854.html on Apr. 14, 2011 (one page).

(56) References Cited

OTHER PUBLICATIONS

Tang et al., "Holey Silicon as an Efficient Thermoelectric Material," *Nano Lett.*, 10 (2010), pp. 4279-4283.
Tao et al., "Langmuir-Blodgett Silver Nanowire Monolayers for Molecular Sensing Using Surface-Enhanced Raman Spectroscopy," *Nano. Lett.* 3, (2003), pp. 1229-1233.
Tritt et al., "Thermoelectrics: Direct solar thermal energy conversion," MRS Bulletin, vol. 33, Apr. 2008.
Van Herwaarden, A.W., "The Seebeck Effect in Silicon ICs.," *Sensors and Actuators*, 6 (1984), pp. 245-254.
Vazquez-Mena et al., "Metallic nanowires by full wafer stencil lithography," Nano Letters, 2008, vol. 8, No. 11, 3675-3682, Aug. 11, 2008.
Venkatasubramanian et al., "Thin-film Thermoelectric Devices with High Room-Temperature Figures of Merit," *Nature*, 413 (2001), pp. 597-602.
Wang et al., "A New Type of Low Power Thermoelectric Micro-Generator Fabricated by Nanowire Array Thermoelectric Material," *Microelectronic Engineering*, 77(3-4): 223-229 (Apr. 1, 2005).
Wang et al., "Complementary Symmetry Silicon Nanowire Logic: Power-Efficient Inverters with Gain," *Small*, 2(10), (2006), pp. 1153-1158.
Weber et al., "Transport Properties of Silicon," *Appl. Phys. A. 53*, (1991), 136-140.
Weiss et al., "Nanoparticle-Textured Surfaces from Spin Coating," *Langmuir*, 24 (2008) pp. 5218-5220.
Wilson, "Thermal Conductivity of Solders," Electronics-cooling.com [retrieved online on Jan. 23, 2014], from the Internet <URL: http://www.electronics-cooling.com/2006/08/thermal-conductivity-of-solders/>, pp. 1-3.
Yamamoto et al., "Thermoelectric transport properties of porous silicon nanostructure," 18th International Conference on Thermoelectricx (1999), © 2000 IEEE 0-7803-5451-6/00.
Yang et al., "Thermoelectric materials for space and automotive power generation," MRS Bulletin, vol. 31, pp. 224-229, Mar. 2006.
Yoo et al., "Thermal Conductivity of Al2O3/Water Nanotluids," *Journal of the Korean Physical Society*, 51 (Oct. 2007), pp. S84-S87.
Zandi et al., "Study of Bulk Micromachining for <100> Silicon," *Eur. Phys. J. Appl. Phys.*, 35 (2006) pp. 7-12.
Zhang et al., "Synthesis of Ordered Single Crystal Silicon Nanowire Arrays," *Adv. Mater.*, 13 (2001), 1238-1241.
Zou et al., "Phonon Heat Conduction in a Semiconductor Nanowire," *J. App. Phys.*, 89(5) (2001) pp. 2932-2938.
Chinese Patent Office, Office Action in CN Application No. 200880113050.3, mailed Aug. 26, 2013.
Chinese Patent Office, Office Action in CN Application No. 200880113050.3, mailed Mar. 5, 2013.
Chinese Patent Office, Office Action in CN Application No. 200880113050.3, mailed Oct. 24, 2011.
Chinese Patent Office, Office Action in CN Application No. 200880113050.3, mailed Sep. 5, 2012.
European Patent Office, Extended European Search Report for EP Application No. 11845164.0, mailed Nov. 6, 2014.
European Patent Office, Extended European Search Report for EP Application No. 11841453.1, mailed Nov. 28, 2014.
European Patent Office, Supplemental Search Report for EP Application No. 08827590, mailed Aug. 5, 2013.
European Patent Office, Supplemental Search Report for EP Application No. 10163141, mailed Aug. 20, 2013.
Japanese Patent Office, Office Action in JP Application No. 2010-522040, mailed Mar. 5, 2013.
Japanese Patent Office, Office Action in JP Application No. 2010-522040, mailed Oct. 15, 2013.
Patent Cooperation Treaty, International Search Report for application PCT/US2010/056356, mailed Jun. 3, 2011.
Patent Cooperation Treaty, Written Opinion of the International Searching Authority for application PCT/US2010/056356, mailed Jun. 3, 2011.
Patent Cooperation Treaty, International Search Report for application PCT/US2011/061301, mailed Jan. 31, 2013.
Patent Cooperation Treaty, Written Opinion of the International Searching Authority for application PCT/US2011/061301, mailed Jan. 31, 2013.
Patent Cooperation Treaty, International Search Report for application PCT/US2011/63000, mailed Apr. 3, 2012.
Patent Cooperation Treaty, Written Opinion of the International Searching Authority for application PCT/US2011/63000, mailed Apr. 3, 2012.
Patent Cooperation Treaty, International Search Report for application PCT/US2011/066108, mailed Apr. 26, 2012.
Patent Cooperation Treaty, Written Opinion of the International Searching Authority for application PCT/US2011/066108, mailed Apr. 26, 2012.
Patent Cooperation Treaty, International Search Report for application PCT/US2012/023425, mailed Sep. 4, 2012.
Patent Cooperation Treaty, Written Opinion of the International Searching Authority for application PCT/US2012/023425, mailed Sep. 4, 2012.
Patent Cooperation Treaty, International Search Report for application PCT/US2013/025060, mailed Apr. 15, 2013.
Patent Cooperation Treaty, Written Opinion of the International Searching Authority for application PCT/US2013/025060, mailed Apr. 15, 2013.
Patent Cooperation Treaty, International Search Report for PCT/US08/73922, mailed Dec. 23, 2008.
Patent Cooperation Treaty, Written Opinion for PCT/US08/73922, mailed Dec. 23, 2008.
Russian Patent Office, Office Action in RU Application No. 2010110307/04, mailed Jun. 1, 2012.
Russian Patent Office, Resolution on Granting Patent for Invention in RU Application No. 2010110307/04, mailed Sep. 11, 2013.
United States Patent and Trademark Office, Office Action issued in U.S. Appl. No. 13/430,558, mailed Apr. 24, 2014.
United States Patent and Trademark Office, Office Action issued in U.S. Appl. No. 12/943,134, mailed Nov. 18, 2013.
United States Patent and Trademark Office, Office Action issued in U.S. Appl. No. 12/943,134, mailed May 22, 2014.
United States Patent and Trademark Office, Office Action issued in U.S. Appl. No. 12/943,134, mailed Jan. 21, 2015.
United States Patent and Trademark Office, Office Action issued in U.S. Appl. No. 13/331,768, mailed Jan. 20, 2015.
United States Patent and Trademark Office, Office Action issued in U.S. Appl. No. 13/364,176, mailed Jan. 27, 2014.
United States Patent and Trademark Office, Office Action issued in U.S. Appl. No. 13/364,176, mailed Sep. 8, 2014.
United States Patent and Trademark Office, Office Action issued in U.S. Appl. No. 13/760,977, mailed Apr. 1, 2014.
United States Patent and Trademark Office, Office Action issued in U.S. Appl. No. 13/760,977, mailed Dec. 2, 2014.
United States Patent and Trademark Office, Office Action issued in U.S. Appl. No. 13/947,400, mailed Oct. 3, 2014.
United States Patent and Trademark Office, Notice of Allowance issued in U.S. Appl. No. 13/786,090, mailed Oct. 9, 2014.
United States Patent and Trademark Office, Notice of Allowance issued in U.S. Appl. No. 14/059,362, mailed Jan. 8, 2015.
United States Patent and Trademark Office, Office Action issued in U.S. Appl. No. 14/203,360, mailed Jun. 10, 2014.
United States Patent and Trademark Office, Notice of Allowance issued in U.S. Appl. No. 14/203,360, mailed Sep. 18, 2014.
United States Patent and Trademark Office, Office Action issued in U.S. Appl. No. 14/203,360, mailed Jan. 26, 2015.

* cited by examiner

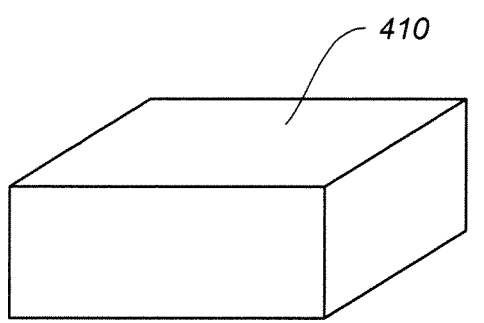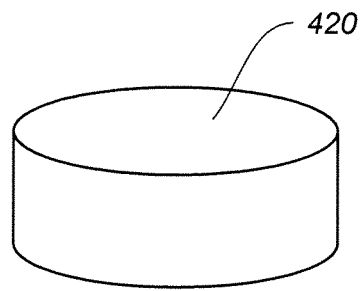
*FIG. 4A*  *FIG. 4B*

ARRAYS OF LONG NANOSTRUCTURES IN SEMICONDUCTOR MATERIALS AND METHODS THEREOF

CROSS-REFERENCES TO RELATED APPLICATIONS

This application is a divisional under 35 U.S.C. §121 of U.S. patent application Ser. No. 13/299,179, filed on Nov. 17, 2011, which claims priority to U.S. Provisional Application No. 61/415,577, filed Nov. 19, 2010, both of which are commonly assigned and incorporated by reference herein for all purposes.

STATEMENT AS TO RIGHTS TO INVENTIONS MADE UNDER FEDERALLY SPONSORED RESEARCH OR DEVELOPMENT

This invention was made with government support under SBIR Contract No. FA8650-10-M-2031 awarded by the U.S. Air Force. The government has certain rights in the invention.

BACKGROUND OF THE INVENTION

The present invention is directed to nanostructures. More particularly, the invention provides arrays of long nanostructures in semiconductor substrates and methods thereof. Merely by way of example, the invention has been applied to arrays of long nanowires in silicon with certain thermoelectric properties. However, it would be recognized that the invention has a much broader range of applicability, including but not limited to use in solar power, battery electrodes and/or energy storage, catalysis, and/or light emitting diodes.

Thermoelectric materials are ones that, in the solid state and with no moving parts, can, for example, convert an appreciable amount of thermal energy into electricity in an applied temperature gradient (e.g., the Seebeck effect) or pump heat in an applied electric field (e.g., the Peltier effect). The applications for solid-state heat engines are numerous, including the generation of electricity from various heat sources whether primary or waste, as well as the cooling of spaces or objects such as microchips and sensors. Interest in the use of thermoelectric devices that comprise thermoelectric materials has grown in recent years in part due to advances in nano-structured materials with enhanced thermoelectric performance (e.g., efficiency, power density, or "thermoelectric figure of merit" ZT, where ZT is equal to $S^2\sigma/k$ and S is the Seebeck coefficient, $\sigma$ the electrical conductivity, and k the thermal conductivity of the thermoelectric material) and also due to the heightened need both for systems that either recover waste heat as electricity to improve energy efficiency or cool integrated circuits to improve their performance.

To date, thermoelectrics have had limited commercial applicability due to the poor cost performance of these devices compared to other technologies that accomplish similar means of energy generation or refrigeration. Where other technologies usually are not as suitable as thermoelectrics for use in lightweight and low footprint applications, thermoelectrics often have nonetheless been limited by their prohibitively high costs. Important in realizing the usefulness of thermoelectrics in commercial applications is the manufacturability of devices that comprise high-performance thermoelectric materials (e.g., modules). These modules are preferably produced in such a way that ensures, for example, maximum performance at minimum cost.

The thermoelectric materials in presently available commercial thermoelectric modules are generally comprised of bismuth telluride or lead telluride, which are both toxic, difficult to manufacture with, and expensive to procure and process. With a strong present need for both alternative energy production and microscale cooling capabilities, the driving force for highly manufacturable, low cost, high performance thermoelectrics is growing.

Thermoelectric devices are often divided into thermoelectric legs made by conventional thermoelectric materials such as $Bi_2Te_3$ and PbTe, contacted electrically, and assembled in a refrigeration (e.g., Peltier) or energy conversion (e.g., Seebeck) device. This often involves bonding the thermoelectric legs to metal contacts in a configuration that allows a series-configured electrical connection while providing a thermally parallel configuration, so as to establish a temperature gradient across all the legs simultaneously. However, many drawbacks may exist in the production of conventional thermoelectric devices. For example, costs associated with processing and assembling the thermoelectric legs made externally is often high. The conventional processing or assembling method usually makes it difficult to manufacture compact thermoelectric devices needed for many thermoelectric applications. Conventional thermoelectric materials are usually toxic and expensive.

Nanostructures often refer to structures that have at least one structural dimension measured on the nanoscale (e.g., between 0.1 nm and 1000 nm). For example, a nanowire is characterized as having a cross-sectional area that has a distance across that is measured on the nanoscale, even though the nanowire may be considerably longer in length. In another example, a nanotube, or hollow nanowire, is characterized by having a wall thickness and total cross-sectional area that has a distance across that is measured on the nanoscale, even though the nanotube may be considerably longer in length. In yet another example, a nanohole is characterized as a void having a cross-sectional area that has a distance across that is measured on the nanoscale, even though the nanohole may be considerably longer in depth. In yet another example, a nanomesh is an array, sometimes interlinked, including a plurality of other nanostructures such as nanowires, nanotubes, and/or nanoholes.

Nanostructures have shown promise for improving thermoelectric performance. The creation of 0D, 1D, or 2D nanostructures from a thermoelectric material may improve the thermoelectric power generation or cooling efficiency of that material in some instances, and sometimes very significantly (a factor of 100 or greater) in other instances. However, many limitations exist in terms of alignment and scale for the nanostructures needed in an actual macroscopic thermoelectric device comprising many nanostructures. The ability to process nanostructures in similar methods to the processing of silicon and other semiconductors would have tremendous cost advantages.

Hence, it is highly desirable to improve techniques for the formation of large arrays of very long nanostructures, such as nanowires or nanoholes, using less expensive and less toxic materials such as silicon, its alloys, and other suitable semiconductors. It is also highly desirable to form these large arrays of very long nanostructures from materials with advantageous electrical and thermal properties for use in thermoelectric devices.

BRIEF SUMMARY OF THE INVENTION

The present invention is directed to nanostructures. More particularly, the invention provides arrays of long nanostructures in semiconductor substrates and methods thereof. Merely by way of example, the invention has been applied to arrays of long nanowires in silicon with certain thermoelectric properties. However, it would be recognized that the invention has a much broader range of applicability, including but not limited to use in solar power, battery electrodes and/or energy storage, catalysis, and/or light emitting diodes.

According to one embodiment, an array of nanowires includes a plurality of nanowires. The plurality of nanowires includes a plurality of first ends and a plurality of second ends respectively. For each of the plurality of nanowires, a corresponding first end selected from the plurality of first ends and a corresponding second end selected from the plurality of second ends are separated by a distance of at least 200 µm. All nanowires of the plurality of nanowires are substantially parallel to each other.

According to another embodiment, an array of nanostructures includes a plurality of nanostructures. The plurality of nanostructures includes a plurality of first ends and a plurality of second ends respectively. For each of the plurality of nanostructures, a corresponding first end selected from the plurality of first ends and a corresponding second end selected from the plurality of second ends are separated by a distance of at least 200 µm. All nanostructures of the plurality of nanostructures are substantially parallel to each other. Each of the plurality of nanostructures includes a semiconductor material.

According to yet another embodiment, an array of nanowires includes a plurality of nanowires. Each of the plurality of nanowires includes a first end at a first surface and a second end. The first end and the second end are separated by a first distance of at least 200 µm. The plurality of nanowires corresponds to a first area on the first surface. All nanowires of the plurality of nanowires are substantially parallel to each other.

According to yet another embodiment, an array of nanostructures includes a plurality of nanostructures. Each of the plurality of nanostructures includes a first end at a first surface and a second end. The first end and the second end are separated by a first distance of at least 200 µm. The plurality of nanostructures corresponds to a first area on the first surface. All nanostructures of the plurality of nanostructures are substantially parallel to each other. Each of the plurality of nanostructures includes a semiconductor material.

According to yet another embodiment, the method for forming an array of nanowires includes: providing a semiconductor substrate including a first surface and one or more second surfaces; masking at least one or more portions of the one or more second surfaces with at least a first portion of the first surface being exposed; applying a metalized film to at least the exposed first portion of the first surface; etching the semiconductor substrate through at least the exposed first portion of the first surface using a first etchant solution; and forming a first plurality of nanowires. Each of the first plurality of nanowires includes a first end at a third surface and a second end. The first end and the second end are separated by a first distance of at least 200 µm. The first plurality of nanowires corresponds to a first area on the first surface. The first area on the first surface substantially corresponds to the exposed first portion of the first surface. All nanowires of the first plurality of nanowires are substantially parallel to each other.

Depending upon the embodiment, one or more of these benefits may be achieved. These benefits and various additional objects, features, and advantages of the present invention can be fully appreciated with reference to the detailed description and accompanying drawings that follow.

BRIEF DESCRIPTION OF THE DRAWINGS

FIGS. 4A and 4B are simplified diagrams showing the semiconductor substrate used to form the array of nanowires as shown in the method of FIG. 3 according to certain embodiments of the present invention.

DETAILED DESCRIPTION OF THE INVENTION

Figure 1A:
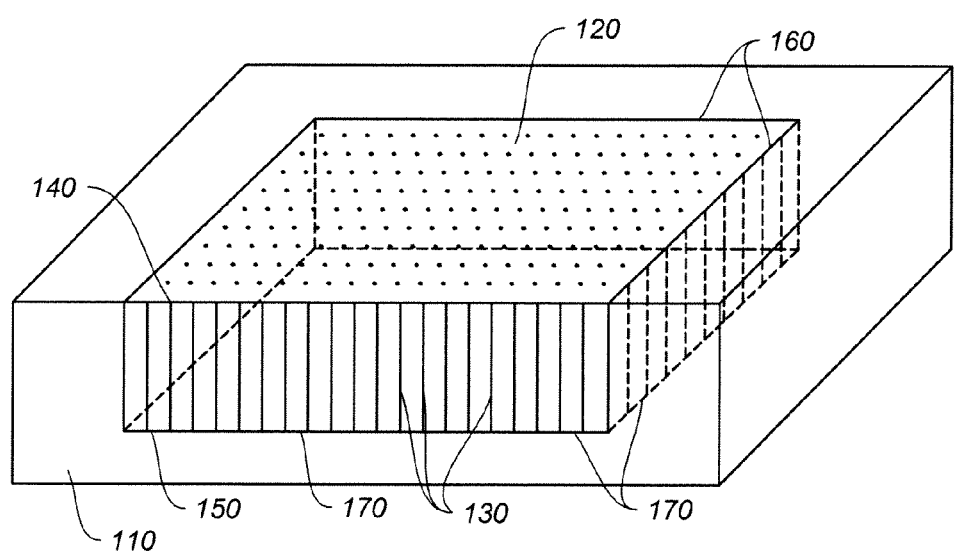
FIG. 1A is a simplified diagram showing an array of nanowires according to one embodiment of the present invention.

The present invention is directed to nanostructures. More particularly, the invention provides arrays of long nanostructures in semiconductor substrates and methods thereof. Merely by way of example, the invention has been applied to arrays of long nanowires in silicon with certain thermoelectric properties. However, it would be recognized that the invention has a much broader range of applicability, including but not limited to use in solar power, battery electrodes and/or energy storage, catalysis, and/or light emitting diodes.

In general, the usefulness of a thermoelectric material depends upon the physical geometry of the material. For example, the larger the surface area of the thermoelectric material that is presented on the hot and cold sides of a thermoelectric device, the greater the ability of the thermoelectric device to support heat and/or energy transfer through an increase in power density. In another example, a suitable minimum distance (i.e., the length of the thermoelectric nanostructure) between the hot and cold sides of the thermoelectric material help to better support a higher thermal gradient across the thermoelectric device. This in turn may increase the ability to support heat and/or energy transfer by increasing power density.

One type of thermoelectric nanostructure is an array of nanowires with suitable thermoelectric properties. Nanowires can have advantageous thermoelectric properties, but to date, conventional nanowires and nanowire arrays have been limited in their technological applicability due to the relatively small sizes of arrays and the short lengths of fabricated nanowires. Another type of nanostructure with thermoelectric applicability is nanoholes or nanomeshes. Nanohole or nanomesh arrays also have limited applicability due to the small volumes into which these nanostructures can be created or synthesized. For example, conventional nanostructures with lengths shorter than 100 µm have limited applicability in power generation and/or heat pumping, and conventional nanostructures with lengths shorter than 10 µm have even less applicability because the ability to maintain or establish a temperature gradient using available heat exchange technology across these short lengths is greatly diminished. Furthermore, in another example, arrays smaller than the wafer dimensions of 4, 6, 8, and 12 inches are commercially limited.

The development of large arrays of very long nanostructures formed using semiconductor materials, such as functionalized silicon, can be useful in the formation of thermoelectric devices. For example, silicon nanostructures that have a low thermal conductivity, and formed within a predetermined area of a semiconductor substrate can be utilized to form a plurality of thermoelectric elements for making a uniwafer thermoelectric device. In another example, functionalized silicon nanowires formed within the predetermined area of the semiconductor substrate can be utilized as the n- or p-type legs or both in an assembled thermoelectric device.

FIG. 1A is a simplified diagram showing an array of nanowires according to one embodiment of the present invention. This diagram is merely an example, which should not unduly limit the scope of the claims. One of ordinary skill in the art would recognize many variations, alternatives, and modifications. In FIG. 1A, an array of nanostructures 120 is formed in a block of semiconductor material (e.g., a semiconductor substrate 110). In one example, the semiconductor substrate 110 is an entire wafer. In another example, the semiconductor substrate 110 is a 4-inch wafer. In yet another example, the semiconductor substrate is a panel larger then a 4-inch wafer. In yet another example, the semiconductor substrate 110 includes silicon.

In some embodiments, the semiconductor substrate 110 is functionalized. For example, the semiconductor substrate 110 is doped to form an n-type semiconductor. In another example, the semiconductor substrate 110 is doped to form a p-type semiconductor. In yet another example, the semiconductor substrates is doped using Group III and/or Group V elements. In yet another example, the semiconductor substrate 110 is functionalized to control the electrical and/or thermal properties of the semiconductor substrate 110. In yet another example, the semiconductor substrate 110 includes silicon doped with boron. In yet another example, the semiconductor substrate 110 is doped to adjust the resistivity of the semiconductor substrate 110 to between approximately 0.00001 Ω-m and 10 Ω-m. In yet another example, the semiconductor substrate 110 is functionalized to provide the array of nanostructures 120 with a thermal conductivity between 0.1 W/m-K and 10 W/m-K.

In other embodiments, the array of nanostructures 120 is formed in the semiconductor substrate 110. For example, the array of nanostructures 120 is formed in substantially all of the semiconductor substrate 110. In another example, the array of nanostructures 120 includes a plurality of very long nanowires 130. In yet another example, each of the plurality of nanowires 130 has a first end 140 and a second end 150. In yet another example, the first ends 140 of the plurality of nanowires 130 collectively form a first surface area of the array of nanostructures 160. In yet another example, the first surface area of the plurality of nanowires 160 is 0.1 mm by 0.0 mm. In yet another example, the first surface area of the plurality of nanowires 160 is 450 mm in diameter. In yet another example, the second ends 150 of the plurality of nanowires 130 collectively form a second surface area of the plurality of nanowires 170. In yet another example, a distance between each of the first ends 140 of the plurality of nanowires 130 and the second ends 150 of each of the plurality of nanowires 130 is at least 200 µm. In yet another example, a distance between each of the first ends 140 of the plurality of nanowires 130 and the second ends 150 of each of the plurality of nanowires 130 is at least 300 µm. In yet another example, a distance between each of the first ends 140 of the plurality of nanowires 130 and the second ends 150 of each of the plurality of nanowires 130 is at least 400 µm. In yet another example, a distance between each of the first ends 140 of the plurality of nanowires 130 and the second ends 150 of each of the plurality of nanowires 130 is at least 500 µm. In yet another example, a distance between each of the first ends 140 of the plurality of nanowires 130 and the second ends 150 of each of the plurality of nanowires 130 is at least 525 µm.

In yet another example, all the nanowires of the plurality of nanowires 130 are substantially parallel to each other. In yet another example, the plurality of nanowires 130 is formed substantially vertically in the semiconductor substrate 110. In yet another example, the plurality of nanowires 130 are oriented substantially perpendicular to the first surface area of the nanostructure 160 and the second surface area of the nanostructure 170. In yet another example, the each of the plurality of nanowires 130 has a roughened surface. In yet another example, each of the plurality of nanowires 130 includes a substantially uniform cross-sectional area with a large ratio of length to cross-sectional area. In yet another example, the cross-sectional area of each of the plurality of nanowires 130 is substantially circular. In yet another example, the cross-sectional area of each of the plurality of nanowires 130 is between 1 nm to 250 nm across. In yet another example, each of the plurality of nanowires 130 are spaced between 25 nm to 250 nm from each other.

Figure 2A:
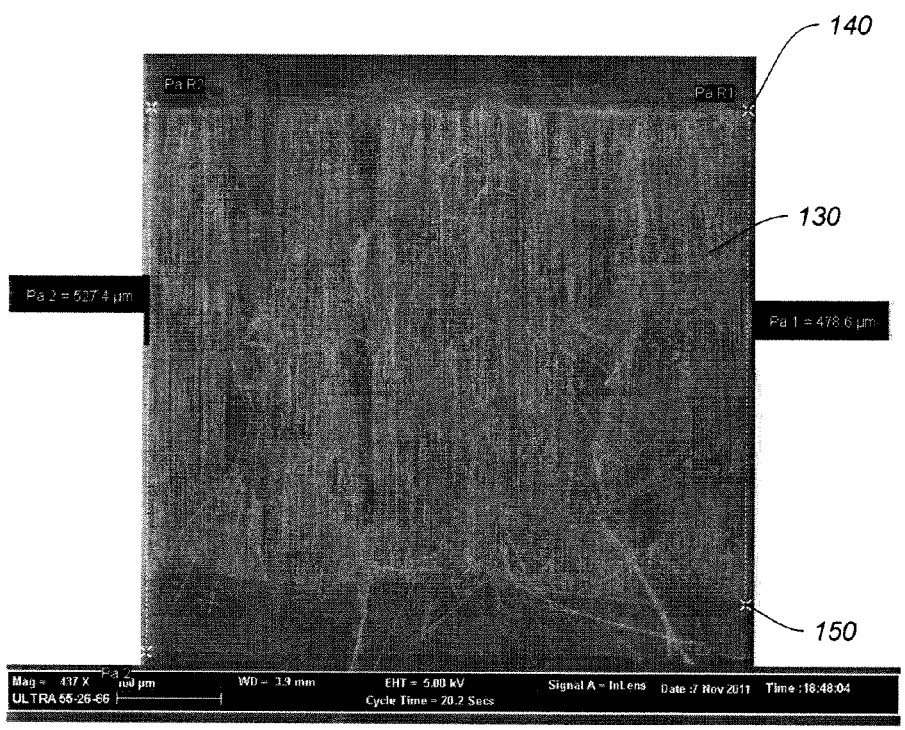
FIGS. 2A, 2B, and 2C are exemplary scanning electron microscope images showing various views of the plurality of nanowires according to certain embodiments of the present invention.
Figure 2B:
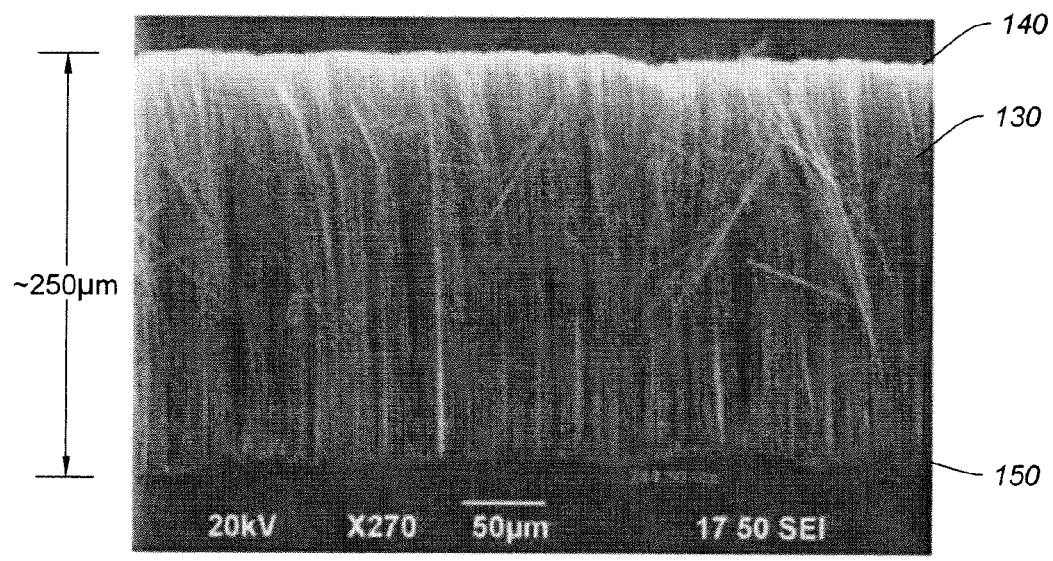
Figure 2C:
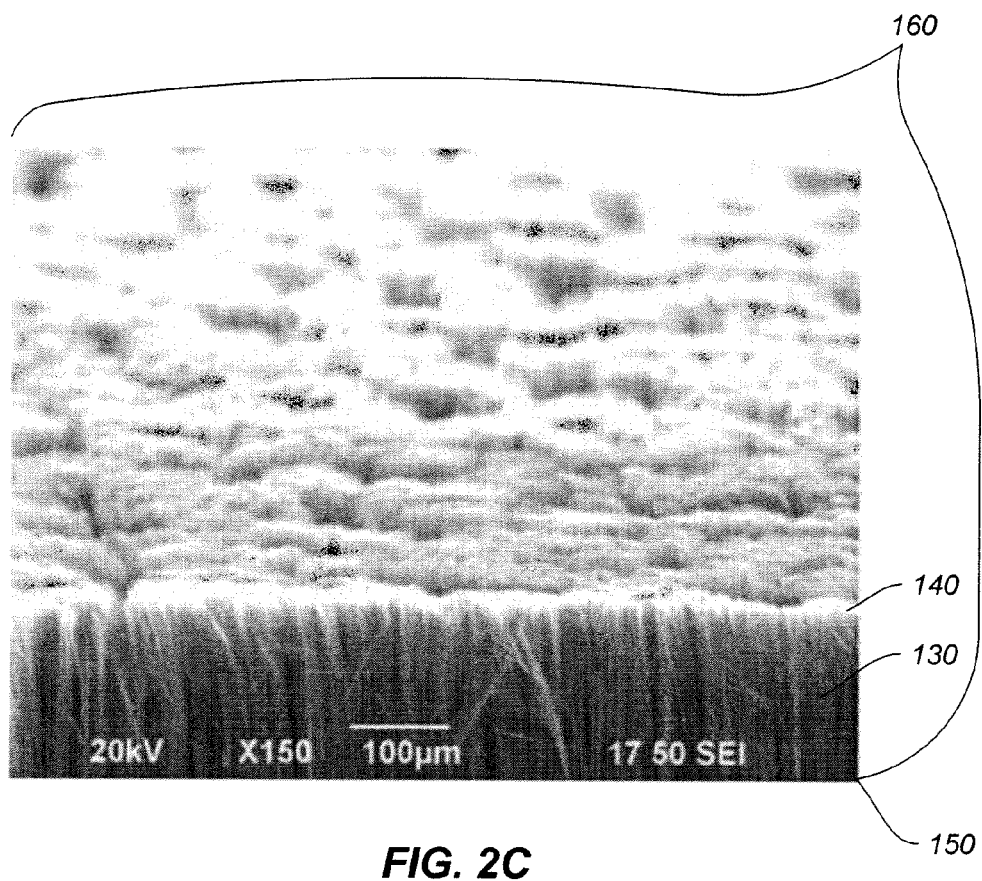

FIGS. 2A, 2B, and 2C are exemplary scanning electron microscope images showing various views of the plurality of nanowires 130 according to certain embodiments of the present invention. These images are merely examples, which should not unduly limit the scope of the claims. One of ordinary skill in the art would recognize many variations, alternatives, and modifications. Each of these exemplary scanning electron microscope images shows a plurality of nanowires 130 with a large ratio of length to cross-sectional area and that are substantially parallel with each other. As shown in FIG. 2A, the plurality of nanowires 130 has the length between each of the respective first ends 140 and each of the respective second ends 150 of approximately 478 µm. As shown in FIG. 2B, the plurality of nanowires 130 has the length between each of the respective first ends 140 and each of the respective second ends 150 of approximately 250 µm. As shown in FIG. 2C, the plurality of nanowires 130 has the length between each of the respective first ends 140 and each of the respective second ends 150 of at least 200 µm. In addition, as shown in FIG. 2C, the array of nanostructures 120 comprising the plurality of nanowires 130 has a very large first surface area 160 and a very large second surface area 170.

As discussed above and further emphasized here, FIG. 1A is merely an example, which should not unduly limit the scope of the claims. One of ordinary skill in the art would recognize many variations, alternatives, and modifications. In some embodiments, nanostructures other than nanowires are formed. For example, nanoholes and/or nanomeshes are formed in the semiconductor substrate 110 to form the array 120.

Figure 1B:
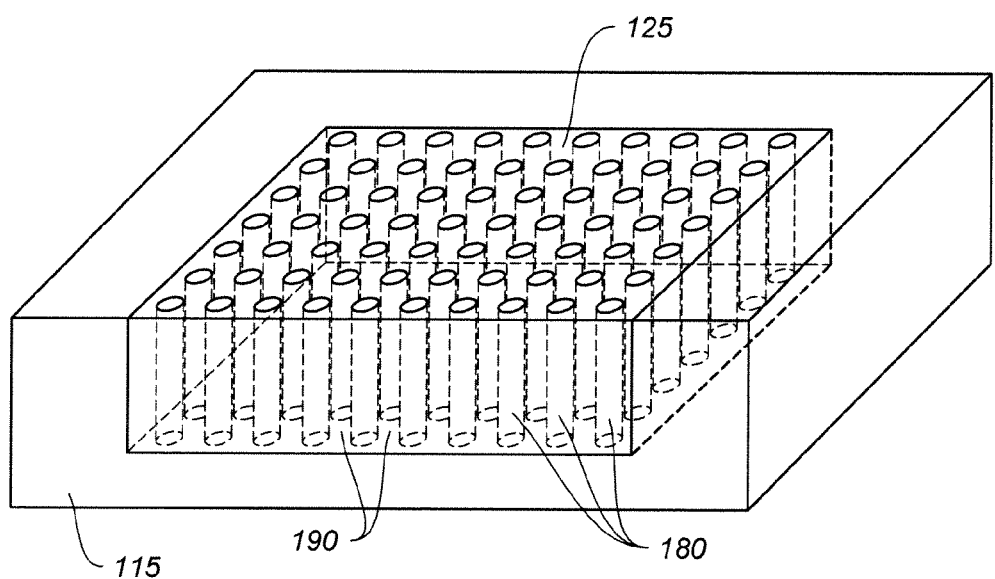
FIG. 1B is a simplified diagram showing an array of nanoholes according to one embodiment of the present invention. This diagram is merely an example, which should not unduly limit the scope of the claims.

FIG. 1B is a simplified diagram showing an array of nanoholes according to one embodiment of the present invention. This diagram is merely an example, which should not unduly limit the scope of the claims. One of ordinary skill in the art would recognize many variations, alternatives, and modifications. In FIG. 1B, an array of nanostructures 125 is formed in a block of semiconductor material (e.g., a semiconductor substrate 115). For example, the semiconductor substrate 115 is the semiconductor substrate 110. In another example, the array of nanostructures 125 includes a plurality of nanoholes 180. In yet another example, each of the plurality of nanoholes 180 has corresponding semiconductor material 190 located around itself.

Figure 3:
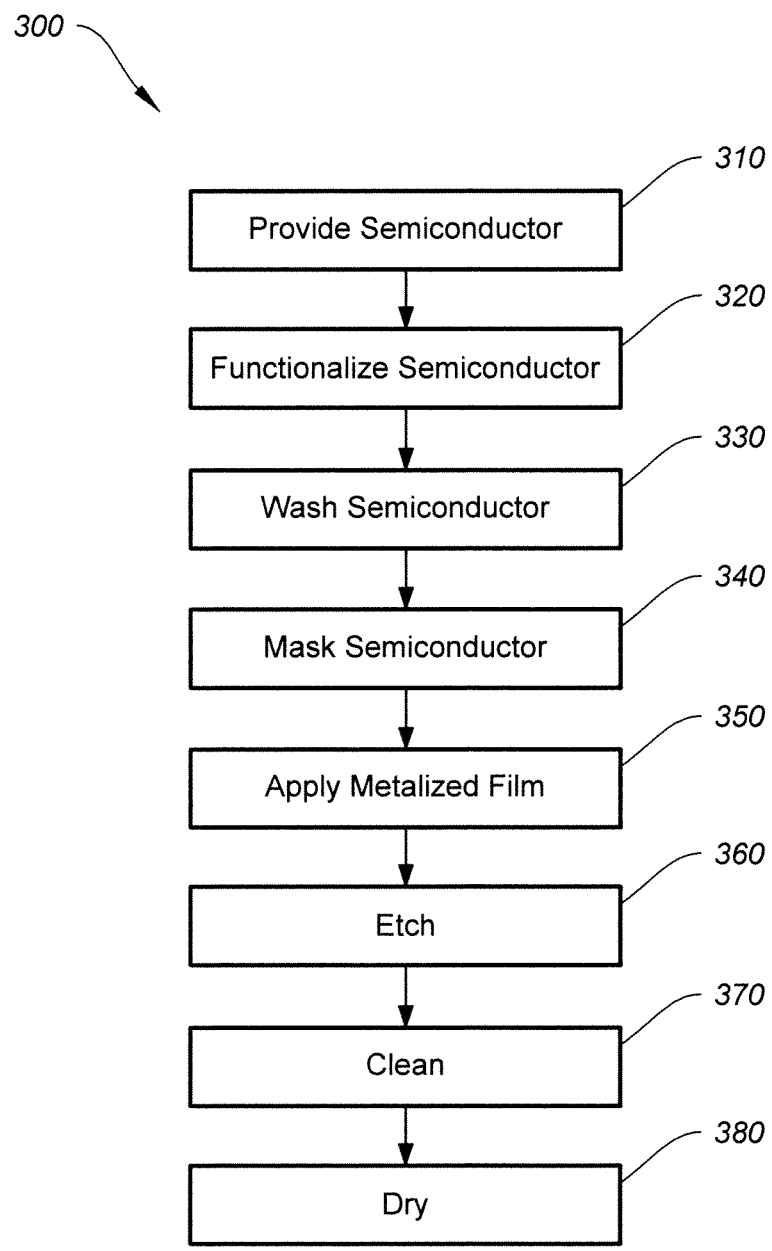
FIG. 3 is a simplified diagram showing a method for forming an array of nanowires in a semiconductor substrate according to one embodiment of the present invention.

FIG. 3 is a simplified diagram showing a method for forming an array of nanowires in a semiconductor substrate according to one embodiment of the present invention. This diagram is merely an example, which should not unduly limit the scope of the claims. One of ordinary skill in the art would recognize many variations, alternatives, and modifications. The method 300 includes a process 310 for providing the semiconductor substrate, a process 320 for functionalizing the semiconductor substrate, a process 330 for washing the semiconductor substrate, a process 340 for masking portions of the semiconductor substrate, a process 350 for applying a metalized film to the semiconductor substrate, a process 360 for etching the semiconductor substrate, a process 370 for cleaning the etched semiconductor substrate, and a process 380 for drying the etched semiconductor substrate. For example, the method 300 is used to form the plurality of nanowires 130 as shown in FIG. 1A. In another example, the method 300 is used to form the plurality of nanoholes 180 as shown in FIG. 1B.

Referring to the process 310, the semiconductor substrate from which the nanostructure will be formed is provided. In one example, the semiconductor substrate is semiconductor substrate 110. In another example, the semiconductor substrate includes silicon. In yet another example, the semiconductor substrate includes GaAs or other semiconductors.

FIGS. 4A and 4B are simplified diagrams showing the semiconductor substrate used to form the array of nanowires as shown in the method of FIG. 3 according to certain embodiments of the present invention. These diagrams are merely examples, which should not unduly limit the scope of the claims. One of ordinary skill in the art would recognize many variations, alternatives, and modifications. As shown in FIGS. 4A and 4B, the semiconductor substrate has one of many possible shapes. In one example, the semiconductor substrate has a substantially block-shaped form 410. In another example, the semiconductor substrate is in the form of a substantially disk-shaped wafer 420. In yet another example, the semiconductor substrate is a 4-inch wafer. In yet another example, the semiconductor substrate has rounded edges.

According to certain embodiments, the optional process 320 for functionalizing the semiconductor can be performed with various methods and to alter various material properties of the semiconductor substrate. For example, the semiconductor substrate is functionalized through one or more subprocesses involving doping, alloying, thermal diffusion treatment, and other material processing techniques. In another example, the semiconductor substrate has its thermoelectric figure of merit enhanced (e.g., through subprocesses or during formation of nanostructures). In another example, the thermal conductivity is reduced and/or electric conductivity increased while the Seebeck coefficient is not decreased significantly.

Figure 5A:
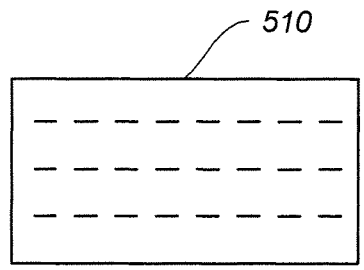
FIGS. 5A and 5B are simplified diagrams showing the functionalized semiconductor substrate used to form the array of nanowires as shown in the method of FIG. 3 according to embodiments of the present invention.
Figure 5B:
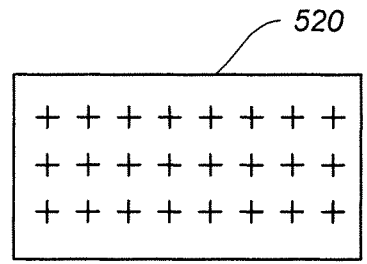

FIGS. 5A and 5B are simplified diagrams showing the functionalized semiconductor substrate used to form the array of nanowires as shown in the method of FIG. 3 according to embodiments of the present invention. These diagrams are merely examples, which should not unduly limit the scope of the claims. One of ordinary skill in the art would recognize many variations, alternatives, and modifications. For example, the functionalized semiconductor substrate is the semiconductor substrate 110. In another example, the semiconductor substrate is doped to form an n-type semiconductor 510. In yet another example, the semiconductor substrate is doped to form a p-type semiconductor 520. In yet another example, the semiconductor substrates is doped using Group III and/or Group V elements. In yet another example, the semiconductor substrate is doped to adjust a resistivity of the semiconductor substrate. In yet another example, the semiconductor substrate includes silicon doped with boron. In yet another example, the semiconductor substrate is doped to adjust the resistivity of the semiconductor substrate to between approximately 0.00001 Ω-m and 10 Ω-m. In yet another example, the semiconductor substrate is functionalized to provide a plurality of nanostructures with a thermal conductivity between 0.1 W/m-K and 10 W/m-K.

At the process 330, the semiconductor substrate is washed according to certain embodiments. In one example, the semiconductor substrate is washed using one or more chemical solutions. In another example, the semiconductor substrate is washed using Piranha solution. In yet another example, the semiconductor substrate is washed using hydrogen fluoride (HF).

According to some embodiments, at the process 340 portions of the semiconductor substrate are masked. According to certain embodiments, portions of the semiconductor substrate are masked to define an exposed surface region of the semiconductor substrate where a plurality of nanostructures are to be formed. For example, one or more masking materials are applied to those areas of the semiconductor substrate where the nanostructure is not desired. In another example, the one or more masking materials includes one or more materials from a group comprising tape, nail polish, photo resist, films (e.g., $Si_3N_4$, SiC, DLC), or any other suitable masking film or material. In yet another example, one or more conductive films are used as the one or more masking materials. In yet another example, the one or more conductive films are selected from a group consisting of Al, SiC, Ti, Ni, Au, Ag, Cr, ITO, Fe, Pt, and Mo. In yet another example, the one or more conductive films allow electrical conductance between an etchant solution and the semiconductor substrate 510 and modify and/or enhance the transfer of electrons or holes during later processing steps. In yet another example, the one or more masking materials are a combination of one or more conductive films and/or one or more non-conductive films.

Figure 6A:
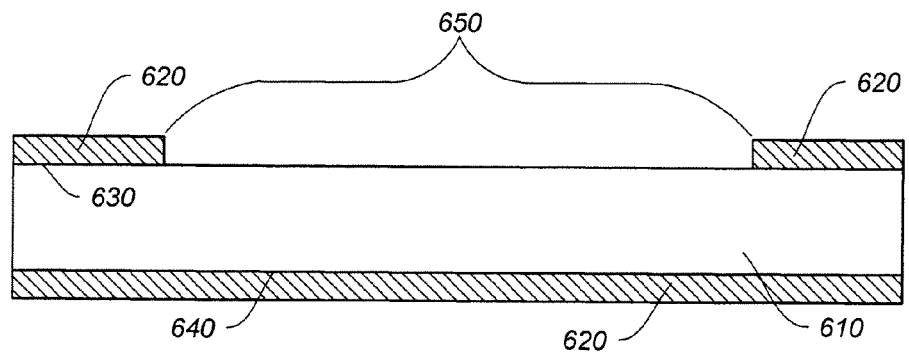
FIG. 6A is a simplified diagram showing a side view of a semiconductor substrate with masking used to form the array of nanowires as shown in the method of FIG. 3 according to one embodiment of the present invention.

FIG. 6A is a simplified diagram showing a side view of a semiconductor substrate with masking used to form the array of nanowires as shown in the method of FIG. 3 according to one embodiment of the present invention. This diagram is merely an example, which should not unduly limit the scope of the claims. One of ordinary skill in the art would recognize many variations, alternatives, and modifications. As shown in FIG. 6A, a semiconductor substrate 610 is shown with one or more masking materials 620. For example, the semiconductor substrate 610 is the semiconductor substrate 110, 410, 420, 510, and/or 520. In another example, the one or more masking materials 620 is applied to portions of a first side 630 of the semiconductor substrate 610. In yet another example, the one or more masking materials 620 is applied to portions of a second side 640 of the semiconductor substrate 640. In yet another example, a surface region 650 of the semiconductor substrate 610 is left exposed for further processing. In yet another example, the exposed surface region 650 roughly corresponds to the first surface area of the nanostructure 160.

Figure 6B:
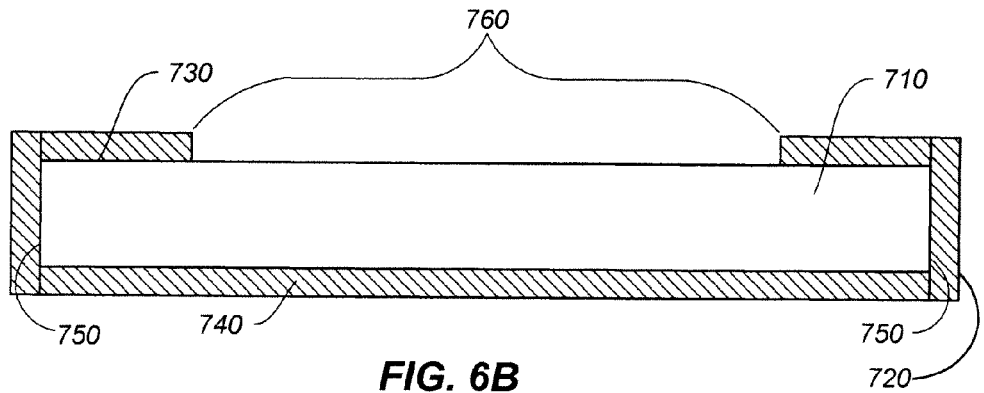
FIG. 6B is a simplified diagram showing a side view of the semiconductor substrate with masking used to form the array of nanowires as shown in the method of FIG. 3 according to another embodiment of the present invention.

As discussed above and further emphasized here, FIG. 6A is merely an example, which should not unduly limit the scope of the claims. One of ordinary skill in the art would recognize many variations, alternatives, and modifications. FIG. 6B is a simplified diagram showing a side view of the semiconductor substrate with masking used to form the array of nanowires as shown in the method of FIG. 3 according to another embodiment of the present invention. This diagram is merely an example, which should not unduly limit the scope of the claims. One of ordinary skill in the art would recognize many variations, alternatives, and modifications. As shown in FIG. 6B, a semiconductor substrate 710 is shown with one or more masking materials 720. For example, the semiconductor substrate 710 is the semiconductor substrate 110, 410, 420, 510, 520, and/or 610. In another example, the one or more masking materials 720 is applied to portions of a first side 730 of the semiconductor substrate 710. In yet another example, the one or more masking materials 720 is applied to portions of a second side 740 of the semiconductor substrate 710. In yet another example, the one or more masking materials 720 applied to the second side 740 of the semiconductor substrate 710 are one or more conductive films and/or materials. In yet another example, the one or more masking materials 720 is applied to one or more edge regions 750 of the semiconductor substrate 710. In yet another example, a surface region 760 of the semiconductor substrate 710 is left exposed for further processing. In yet another example, the exposed surface region 760 roughly corresponds to the first surface area of the nanostructure 160.

Figure 7A:
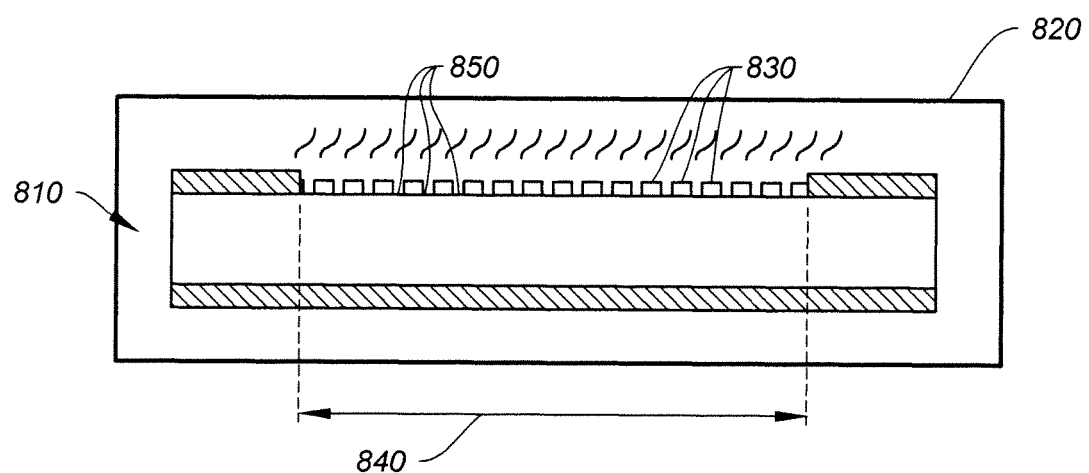
FIG. 7A is a simplified diagram showing a side view of the masked semiconductor substrate with a metalized film used to form the array of nanowires as shown in the method of FIG. 3 according to one embodiment of the present invention.

FIG. 7A is a simplified diagram showing a side view of the masked semiconductor substrate with a metalized film used to form the array of nanowires as shown in the method of FIG. 3 according to one embodiment of the present invention. This diagram is merely an example, which should not unduly limit the scope of the claims. One of ordinary skill in the art would recognize many variations, alternatives, and modifications. As shown in FIG. 7A, according to certain embodiments, at the process 350 a metalized film is applied to the exposed surface region 840 of the semiconductor substrate 810. In one example, the masked semiconductor substrate 810 is transferred to a deposition station 820 for forming a metalized film 830 on the exposed surface region 840. In another example the exposed surface region 840 is the surface region 650 and/or the surface region 760. In yet another example, the metalized film 830 includes one or more metals selected from a group consisting of Ag, Au, Pt, Pd, Ni, Cu, and/or any other transition metals.

In yet another example, the metalized film 830 includes a porous structure. In yet another example, the metalized film 830 includes a partial layer with holes 850. In yet another example, the porous structure includes nanoscale holes 850 over the corresponding exposed surface region 840. In yet another example, the metalized film 830 defines a pattern to guide further processing steps. In yet another example, the areas of the metalized film 830 with holes 850 allow the semiconductor so exposed to be susceptible to oxidation. In yet another example, the oxidized semiconductor protects the underlying semiconductor substrate 810 from further processing steps.

According to other embodiments, the metalized film 830 is formed by various processes. In one example, the metalized film 830 is applied by electroless deposition in an HF solution. In another example, the metalized film 830 is formed by sputtering deposition in a vacuum chamber. In yet another example, the metalized film 830 is applied by thermo evaporation. In yet another example, the metalized film 830 is applied by electrochemical deposition. In yet another example, the metalized film 830 is deposited using a lithography process. In yet another example, the lithography process include a wet etch, a dry etch, and/or lift-off techniques. In yet another example, the process 350 for applying the metalized film 830 is controlled to obtain a desired distribution and size of the holes 850. In yet another example, each of the holes 850 defines the location and size of a nanowire.

Figure 7B:
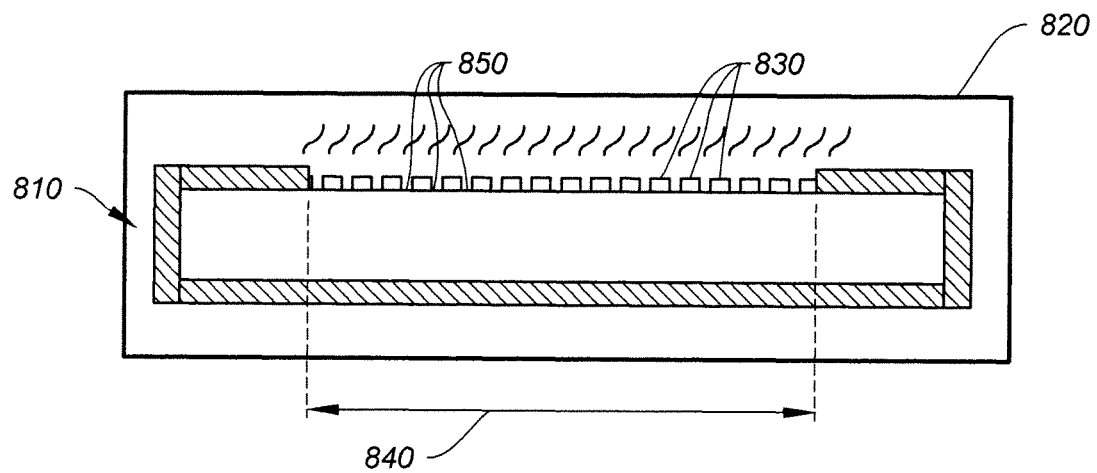
FIG. 7B is a simplified diagram showing a side view of the masked semiconductor substrate with a metalized film used to form the array of nanowires as shown in the method of FIG. 3 according to another embodiment of the present invention.

As discussed above and further emphasized here, FIG. 7A is merely an example, which should not unduly limit the scope of the claims. One of ordinary skill in the art would recognize many variations, alternatives, and modifications. FIG. 7B is a simplified diagram showing a side view of the masked semiconductor substrate with a metalized film used to form the array of nanowires as shown in the method of FIG. 3 according to another embodiment of the present invention. This diagram is merely an example, which should not unduly limit the scope of the claims. One of ordinary skill in the art would recognize many variations, alternatives, and modifications. As shown in FIG. 7B, at the process 350 for applying a metalized film to the semiconductor substrate 810, the semiconductor substrate 810 is masked on the first side, the second side, and on one or more edge regions.

Figure 8A:
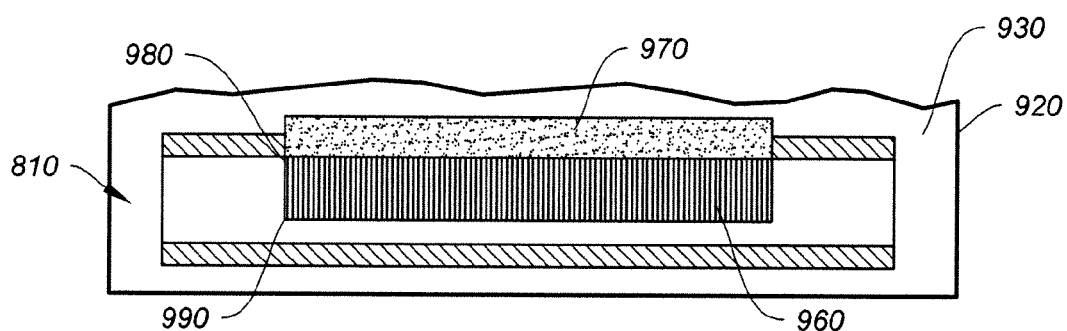
FIG. 8A is a simplified diagram showing a side view of the semiconductor substrate during the etching process used to form the array of nanowires as shown in the method of FIG. 3 according to another embodiment of the present invention.

FIG. 8A is a simplified diagram showing a side view of the semiconductor substrate 810 during the etching process 360 used to form the array of nanowires as shown in the method of FIG. 3 according to one embodiment of the present invention. This diagram is merely an example, which should not unduly limit the scope of the claims. One of ordinary skill in the art would recognize many variations, alternatives, and modifications. As shown in FIG. 8A, the masked semiconductor substrate with metalized film 810 is placed in an etching vessel 920 to form a nanostructure using a wet etching process. For example, the masked semiconductor substrate with metalized film 810 is dipped into an etchant solution 930 including HF and one or more oxidizing agents. In another example, the one or more oxidizing agents are selected from a group consisting of $AgNO_3$, $KNO_3$, $NaNO_3$, $Fe(NO_3)_3$, $H_2O_2$, $Ag_2CrO_4$, $Ag_2CrO_4$, $KMnO_4$, $HNO_3$ and the like. In yet another example, the one or more oxidizing agents is added during preparation of the etchant solution 930. In yet another example, the one or more oxidizing agents is added regularly and/or irregularly during the process 360 for etching the semiconductor substrate.

In yet another example, the etching process 360 executes in a highly anisotropic manner in a direction substantially strictly into the semiconductor substrate 810. In yet another example, the metallic particles in the metalized film 830 catalyze the etching of the underlying semiconductor substrate. In yet another example, the semiconductor substrate 810 under the holes 850 in the metalized film 830 develop a semiconductor oxide that substantially protects those portions of the semiconductor substrate 810 from etching. In yet another example, a plurality of nanowires 960 form under each of the holes 850 as the semiconductor substrate around each of the plurality of nanowires 960 is etched away. In yet another example, the plurality of nanowires 960 is the plurality of nanowires 130. In yet another example, the length of the plurality of nanowires 960 is controlled by the choice of etchant solution 930, temperature during the etching process 360, and/or duration of the etching process 360. In yet another example, the temperature is raised above room temperature. In yet another example, the temperature is lowered below room temperature. In yet another example, a metal dendrite structure 970 forms on the surface of the semiconductor substrate 810. In yet another example, the metal dendrite structure 970 is altered by the addition of one or more chemicals selected from a group consisting of $KMnO_4$, $HNO_3$, and the like.

According to certain embodiments, one or more dimensions of each of the plurality of nanowires 960 is controlled. For example, the cross-sectional area of each of the plurality of nanowires 960 is controlled by the shape and size of the holes 850 in the metalized film 830. In another example, each of the plurality of nanowires 960 has a first end 980. In yet another example, each of the plurality of nanowires 960 has a second end 990. In yet another example, a distance between each of the first ends 980 of the plurality of nanowires 960 and the second ends 990 of each of the plurality of nanowires 960 is at least 200 µm. In yet another example, a distance between each of the first ends 980 of the plurality of nanowires 960 and the second ends 990 of each of the plurality of nanowires 960 is at least 400 µm. In yet another example, a distance between each of the first ends 980 of the plurality of nanowires 960 and the second ends 990 of each of the plurality of nanowires 960 is at least 500 µm.

In other embodiments, the etchant solution 930 includes HF, $AgNO_3$, and $H_2O$. For example, the molar concentration of the HF in the etchant solution 930 varies from 2M to 10M. In another example, the molar concentration of $AgNO_3$ in the etchant solution 930 varies from 0.001M to 0.5M. In yet another example, other molar concentrations vary depending on the etching parameters desired. In yet another embodiment, $KNO_3$ is added to the etchant solution 930. In one example, the $KNO_3$ is added to the etchant solution 930 after a certain time period of initial etching without $KNO_3$ in the etchant solution 930. In another example, $KNO_3$ is added to the etchant solution 930 all at once. In yet another example, $KNO_3$ is added to the etchant solution 930 continuously at a predetermined rate. In yet another example, KNO3 is added to the etchant solution 930 to maintain the proper balance between Ag and Ag+ to control the etching rate, the anisotropy, and/or other etch characteristics. In yet another embodiment, other oxidizing agents other than KNO3 are added to the etchant solution 930. In yet another embodiment, the process 360 for etching the semiconductor substrate 810 includes multiple subprocesses. In one example, a first etchant solution including HF, $AgNO_3$, and $H_2O$ is used for a first time period and then a second etchant solution including HF, $H_2O_2$, and $H_2O$ is used for a second time period. In another example, a third etchant solution including HF, $AgNO_3$, and $H_2O$ is used for a third time period and then a fourth etchant solution including HF, $Fe(NO_3)_3$, and $H_2O$ is used for a fourth time period.

As discussed above and further emphasized here, FIG. 8A is merely an example, which should not unduly limit the scope of the claims. One of ordinary skill in the art would recognize many variations, alternatives, and modifications. In one embodiment, the volume of etchant solution 930 is controlled relative to the volume of semiconductor substrate 810 to be removed during the process 360 for etching the semiconductor substrate 810. For example, to remove one mole of semiconductor substrate 810 requires at least six moles of HF and at least one mole of the one or more oxidizing agents. In another embodiment, the etchant solution 930 is stirred during the process 360 for etching the semiconductor substrate 810. In yet another embodiment, the etchant solution 960 is recirculated in the etching vessel 920 during the process 360 for etching the semiconductor substrate 810. In yet another embodiment, the process 360 for etching the semiconductor substrate 810 is assisted by ultrasonic and/or megasonic energy. In yet another embodiment, various additional parameters of the process 360 for etching the semiconductor substrate 810 are controlled such as pressure, light exposure, and the like.

Figure 8B:
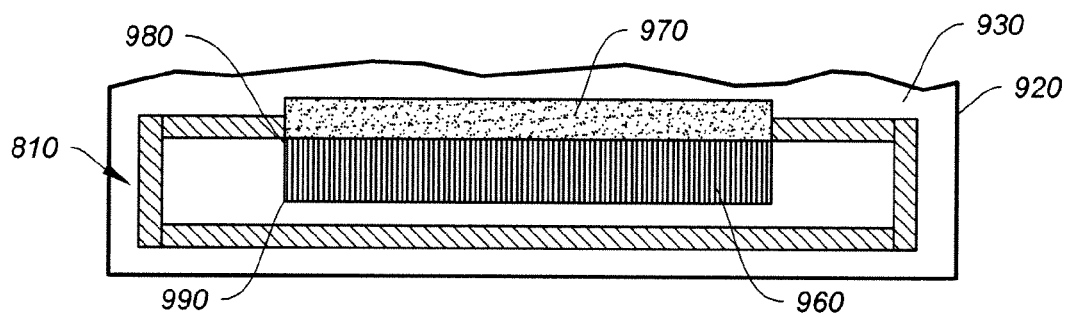
FIG. 8B is a simplified diagram showing a side view of the semiconductor substrate during the etching process used to form the array of nanowires as shown in the method of FIG. 3 according to another embodiment of the present invention.

FIG. 8B is a simplified diagram showing a side view of the semiconductor substrate 810 during the etching process 360 used to form the array of nanowires as shown in the method of FIG. 3 according to another embodiment of the present invention. This diagram is merely an example, which should not unduly limit the scope of the claims. One of ordinary skill in the art would recognize many variations, alternatives, and modifications. As shown in FIG. 8B, at the process 360 for etching the semiconductor substrate 810, the semiconductor substrate 810 is masked on the first side, the second side, and on one or more edge regions.

Figure 9:
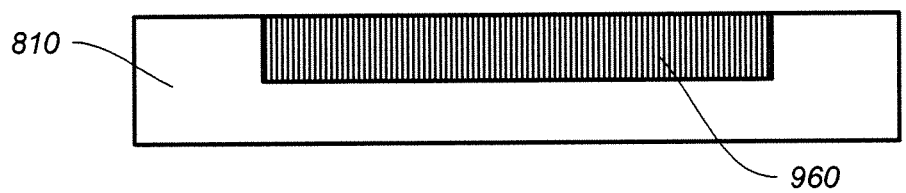
FIG. 9 is a simplified diagram showing a side view of the semiconductor substrate with the plurality of nanowires according to one embodiment of the present invention.

FIG. 9 is a simplified diagram showing a side view of the semiconductor substrate 810 with the plurality of nanowires 960 according to one embodiment of the present invention. This diagram is merely an example, which should not unduly limit the scope of the claims. One of ordinary skill in the art would recognize many variations, alternatives, and modifications. As shown in FIG. 9, the semiconductor substrate 810 with the plurality of nanowires 960 is depicted after the optional process 370 for cleaning the etched semiconductor substrate 810. For example, the semiconductor substrate 810 is cleaned to remove the metal dendrites 970 formed during the etching process 360. In another example, the metal dendrites 970 are removed by rinsing the semiconductor substrate 810 in one or more chemicals selected from a group consisting of $HNO_3$, diluted $HNO_3$, $NH_4OH$ with $H_2O_2$, or the like. In yet another example, the rinsing with $HNO_3$ is assisted by one or more of ultrasound, megasound, stirring, gas injection, and/or other suitable techniques. In yet another example, the process 370 for cleaning the etched semiconductor substrate 810 includes one or more intermediate rinses using water or a neutralization solution including water with $CaCO_3$ or the like. In yet another example, the process 370 for cleaning the etched semiconductor substrate 810 includes removing the one or more masking materials 620 and/or the one or more masking materials 720.

In other embodiments, the method 300 for forming the nanostructure in the semiconductor substrate 810 includes an optional process 380 for drying the etched semiconductor substrate 810. In one example, the process 380 for drying the etched semiconductor substrate 810 removes any liquid residues from the semiconductor substrate 810 and/or the plurality of nanowires 960. In another example, the process 380 for drying the etched semiconductor substrate 810 includes using natural or forced convection. In yet another example, the process 380 for drying the etched semiconductor substrate 810 includes heating the semiconductor substrate 810 to an elevated temperature. In yet another example the elevated temperature is not to exceed 500 degrees C. In yet another example, the process 380 varies in length from 10 seconds to 24 hours. In yet another example, the process 380 for drying the etched semiconductor substrate 810 includes the use of a Critical Point Dryer (CPD). In yet another example, the process 380 for drying the etched semiconductor substrate 810 includes the use of low surface tension materials.

As discussed above and further emphasized here, FIGS. 3-9 are merely examples, which should not unduly limit the scope of the claims. One of ordinary skill in the art would recognize many variations, alternatives, and modifications. In some embodiments, nanostructures other than nanowires are formed. For example, nanoholes, nanotubes, and/or nanomeshes are formed in the semiconductor substrate. In another example, a plurality of nanoholes 180 are formed in the semiconductor substrate as shown in FIG. 1B. In other embodiments, the process 350 for applying a metalized film to the semiconductor substrate occurs during the process 360 for etching the semiconductor substrate. In yet other embodiments, at the process 340 for masking portions of the semiconductor substrate, the one or more masking materials is applied to define a plurality of exposed surface regions on the semiconductor substrate.

Figure 10A:
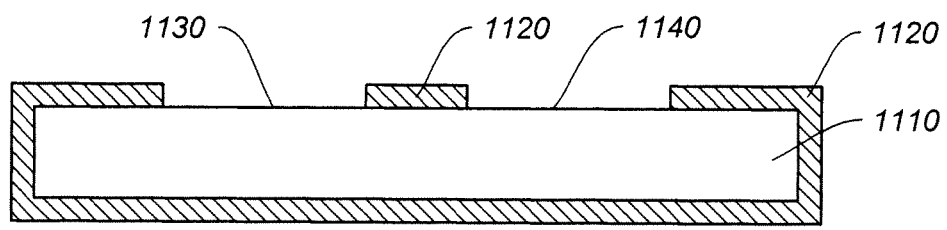
FIGS. 10A and 10B are simplified diagrams showing formation of a first plurality of nanowires and a second plurality of nanowires in a semiconductor substrate according to one embodiment of the present invention.
Figure 10B:
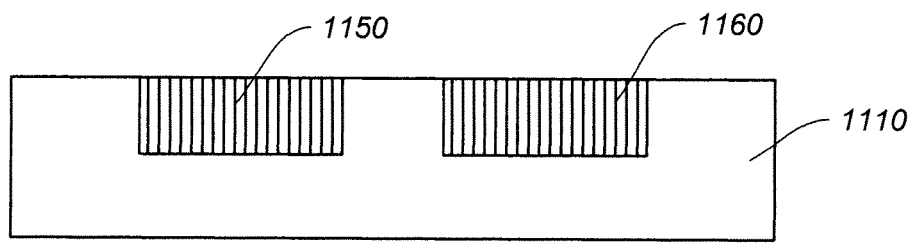

FIGS. 10A and 10B are simplified diagrams showing formation of a first plurality of nanowires and a second plurality of nanowires in a semiconductor substrate according to one embodiment of the present invention. This diagram is merely an example, which should not unduly limit the scope of the claims. One of ordinary skill in the art would recognize many variations, alternatives, and modifications. As shown in FIG. 10A, the semiconductor substrate 1110 is masked during process 340 with one or more masking materials 1120 to define a first exposed surface region 1130 and a second exposed surface region 1140. After the process 350 for applying a metalized film to the semiconductor substrate 1110, the process 360 for etching the semiconductor substrate 1110, and the optional process 370 for cleaning the etched semiconductor substrate 1110, the semiconductor substrate 1110 has a first plurality of nanowires 1150 and a second plurality of nanowires 1160 roughly corresponding to the first exposed surface region 1130 and the second exposed surface region 1140 respectively, as shown in FIG. 10B. In yet another example, the first plurality of nanowires 1150 and the second plurality of nanowires 1160 are the array 120.

Figure 11A:
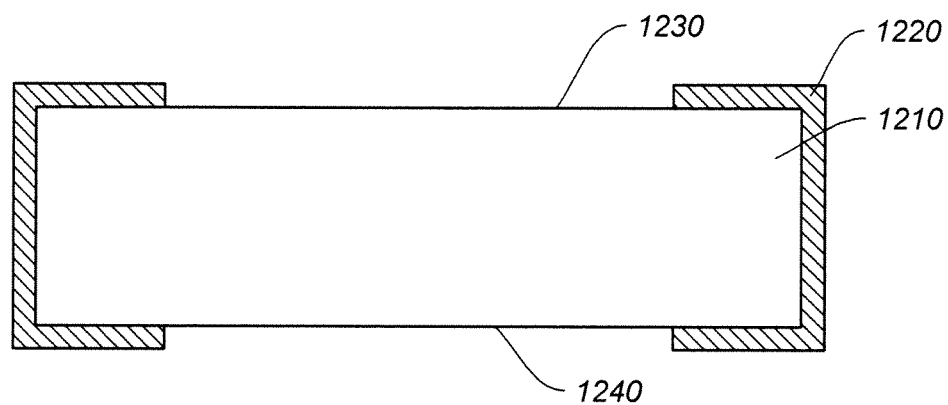
FIGS. 11A and 11B are simplified diagrams showing formation of a first plurality of nanowires and a second plurality of nanowires in a semiconductor substrate according to another embodiment of the present invention.
Figure 11B:
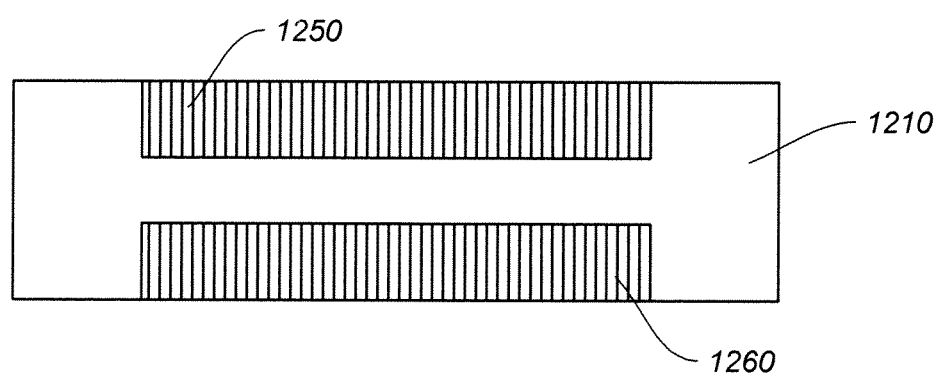

FIGS. 11A and 11B are simplified diagrams showing formation of a first plurality of nanowires and a second plurality of nanowires in a semiconductor substrate according to another embodiment of the present invention. These diagrams are merely examples, which should not unduly limit the scope of the claims. One of ordinary skill in the art would recognize many variations, alternatives, and modifications. As shown in FIG. 11A, the semiconductor substrate 1210 is masked during process 340 with one or more masking materials 1220 to define a first exposed surface region 1230 and a second exposed surface region 1240. After the process 350 for applying a metalized film to the semiconductor substrate 1210, the process 360 for etching the semiconductor substrate 1210, and the optional process 370 for cleaning the etched semiconductor substrate 1210, the semiconductor substrate 1210 has a first plurality of nanowires 1250 and a second plurality of nanowires 1260 roughly corresponding to the first exposed surface region 1230 and the second exposed surface region 1240 respectively, as shown in FIG. 11B. In yet another example, the first plurality of nanowires 1250 and the second plurality of nanowires 1260 are the array 120.

Figure 11C:
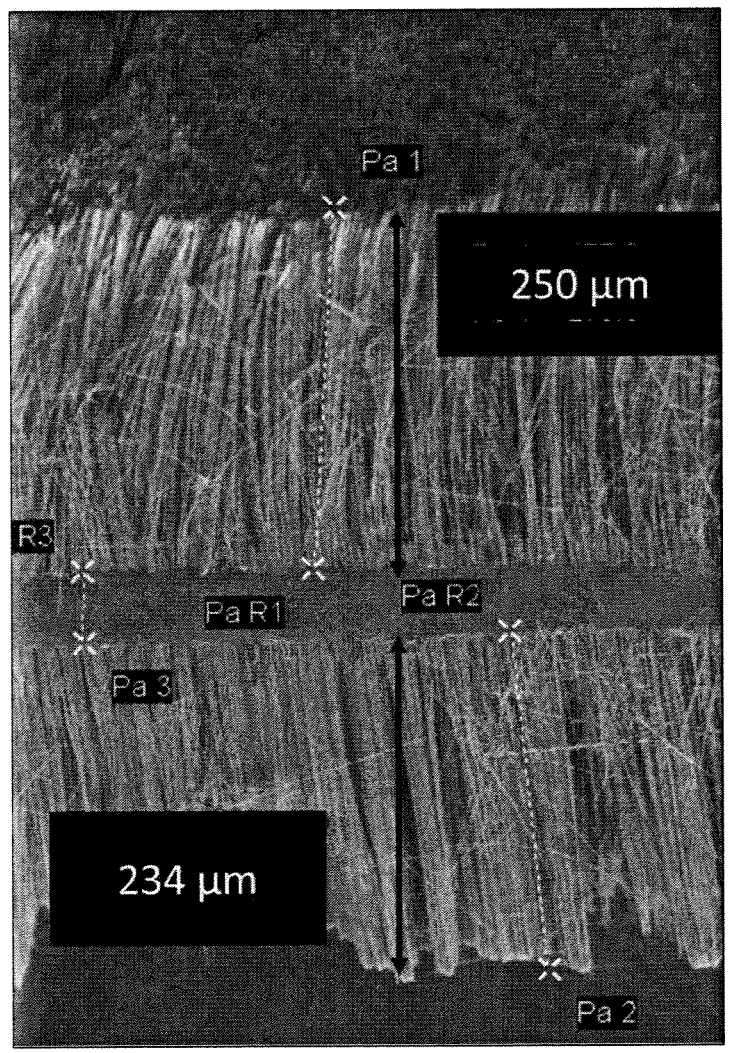
FIG. 11C is an exemplary scanning electron microscope image showing the first plurality of nanowires and the second plurality of nanowires as shown in FIG. 11B according to certain embodiments of the present invention.

FIG. 11C is an exemplary scanning electron microscope image showing the first plurality of nanowires 1250 and the second plurality of nanowires 1260 as shown in FIG. 11B according to certain embodiments of the present invention. This image is merely an example, which should not unduly limit the scope of the claims. One of ordinary skill in the art would recognize many variations, alternatives, and modifications.

As discussed above and further emphasized here, FIG. 3 is merely an example, which should not unduly limit the scope of the claims. One of ordinary skill in the art would recognize many variations, alternatives, and modifications. In some embodiments, the method 300 includes a process for de-fasciculization of the formed nanostructure. For example, if the first ends 980 of the plurality of nanowires 960 are excessively fascicled, the amount of fasciculation is reduced or suppressed. In another example, reducing fasciculation includes etching of first ends 980 of each of the plurality of nanowires 960. In yet another example, reducing fasciculation includes applying electrical charges stronger than the attractive forces between the first ends 980 of the plurality of nanowires 960.

Figure 12:
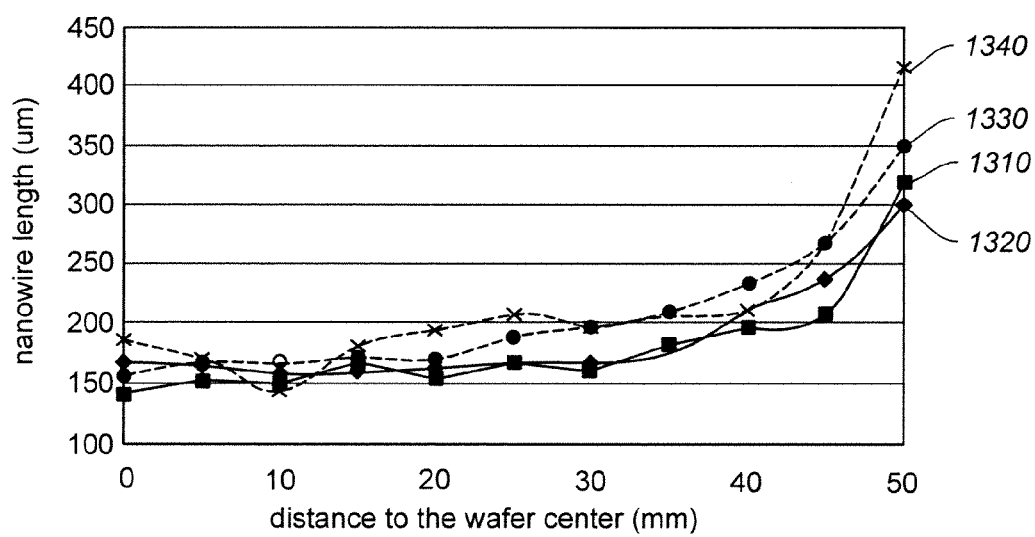
FIG. 12 is a simplified diagram showing a relationship between nanowire length and nanowire location on a semiconductor substrate as formed according to certain embodiments of the present invention.

FIG. 12 is a simplified diagram showing a relationship between nanowire length and nanowire location on a semiconductor substrate as formed according to certain embodiments of the present invention. This diagram is merely an example, which should not unduly limit the scope of the claims. One of ordinary skill in the art would recognize many variations, alternatives, and modifications. As shown in FIG. 12, the length of the formed nanowires varies based on the distance the nanowire is located from the center of the semiconductor substrate on which the nanowire is formed. Two exemplary results are shown for a 4-inch p-type silicon wafer doped with boron to set the resistivity in the range of about 0.0006 Ω-m to 0.0012 Ω-m using the solid lines and the square 1310 and diamond plot markers 1320. Two additional exemplary results are shown for a 4-inch p-type silicon wafer doped with boron to set the resistivity in the range of about 0.1 Ω-m to 0.3 Ω-m using the dashed lines and the circle 1330 and "x" plot markers 1340. In all four examples, substantially all of one side of the 4-inch silicon wafer was etched using an etchant solution including HF and AgNO$_3$ for 24 hours. As FIG. 12 shows, the average nanowire lengths is in excess of 200 μm and the maximum length is greater than 400 μm. Also, the nanowires over a majority portion of the 4-inch wafer are substantially uniform in length.

Figure 13:
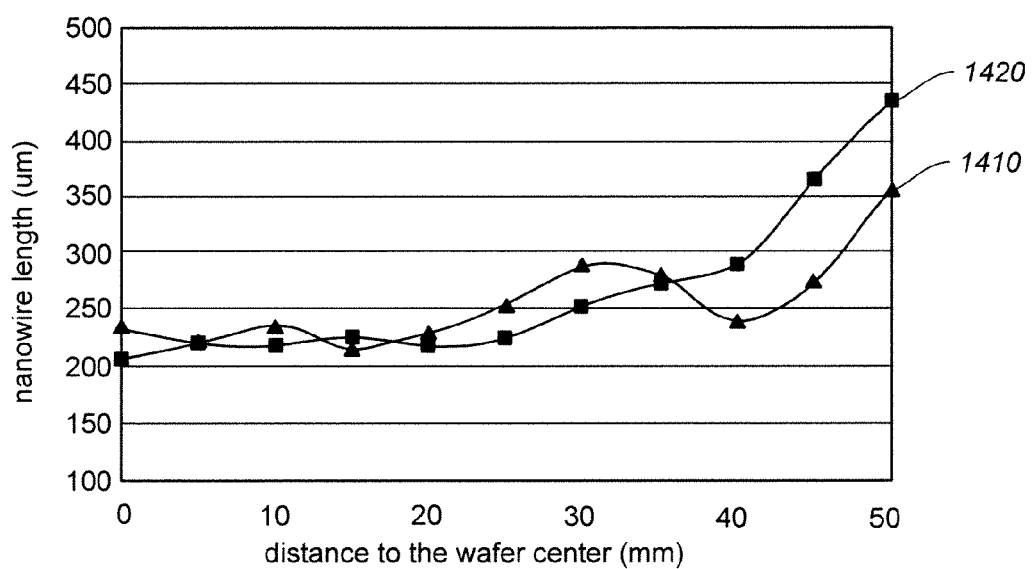
FIG. 13 is a simplified diagram showing a relationship between nanowire length and nanowire location on a semiconductor substrate as formed according to some embodiments of the present invention.

FIG. 13 is a simplified diagram showing a relationship between nanowire length and nanowire location on a semiconductor substrate as formed according to some embodiments of the present invention. This diagram is merely an example, which should not unduly limit the scope of the claims. One of ordinary skill in the art would recognize many variations, alternatives, and modifications. As shown in FIG. 13, the length of the formed nanowires varies based on the distance the nanowire is located from the center of the semiconductor substrate on which the nanowire is formed. In the examples of FIG. 13, substantially all of one side of a 4-inch p-type silicon wafer doped with boron to set the resistivity in the range of about 0.1 Ω-m to 0.3 Ω-m silicon wafer was etched in an etchant solution including HF and AgNO$_3$ solution at varying temperatures. For the plot line with triangular plot markers 1410, the etching took place in an ice-bath for 42 hours. For the plot-line with square plot markers 1420, the etching took place on an 80 degrees C. hot plate for 18 hours and 40 minutes. As FIG. 13 shows, the average nanowire lengths is in excess of 200 μm and the maximum length is greater than 400 μm. Also, the nanowires over a majority portion of the 4-inch wafer are substantially uniform in length.

According to one embodiment, an array of nanowires includes a plurality of nanowires. The plurality of nanowires includes a plurality of first ends and a plurality of second ends respectively. For each of the plurality of nanowires, a corresponding first end selected from the plurality of first ends and a corresponding second end selected from the plurality of second ends are separated by a distance of at least 200 μm. All nanowires of the plurality of nanowires are substantially parallel to each other. For example, the array of nanowires is implemented according to at least FIG. 1A, FIG. 2A, FIG. 2B, and/or FIG. 9.

In another example, the distance is at least 300 μm. In yet another example, the distance is at least 400 μm. In yet another example, the distance is at least 500 μm. In yet another example, the distance is at least 525 μm. In yet another example, each of the plurality of nanowires includes a semiconductor material. In yet another example, the semiconductor material is silicon.

According to another embodiment, an array of nanostructures includes a plurality of nanostructures. The plurality of nanostructures includes a plurality of first ends and a plurality of second ends respectively. For each of the plurality of nanostructures, a corresponding first end selected from the plurality of first ends and a corresponding second end selected from the plurality of second ends are separated by a distance of at least 200 μm. All nanostructures of the plurality of nanostructures are substantially parallel to each other. Each of the plurality of nanostructures includes a semiconductor material. For example, the array of nanostructures is implemented according to at least FIG. 1A, FIG. 1B, FIG. 2A, FIG. 2B, and/or FIG. 9.

In another example, the semiconductor material is silicon. In yet another example, the distance is at least 300 μm. In yet another example, the distance is at least 400 μm. In yet another example, the distance is at least 500 μm. In yet another example, the distance is at least 525 μm. In yet another example, the plurality of nanostructures corresponds to a plurality of nanoholes respectively.

According to yet another embodiment, an array of nanowires includes a plurality of nanowires. Each of the plurality of nanowires includes a first end (e.g., the end 150) at a first surface and a second end (e.g., the end 140). The first end and the second end are separated by a first distance of at least 200 μm. The plurality of nanowires corresponds to a first area on the first surface. All nanowires of the plurality of nanowires are substantially parallel to each other. For example, the array of nanowires is implemented according to at least FIG. 1A, FIG. 2A, FIG. 2B, and/or FIG. 9.

In another example, the plurality of nanowires is a part of a thermoelectric device. In yet another example, the first distance is at least 300 μm. In yet another example, the first distance is at least 400 μm. In yet another example, the first distance is at least 500 μm. In yet another example, the first distance is at least 525 μm. In yet another example, the first area is at least 100 mm$^2$ in size. In yet another example, the first area is at least 1000 mm$^2$ in size. In yet another example, the first area is at least 2500 mm$^2$ in size. In yet another example, the first area is at least 5000 mm$^2$ in size.

In yet another example, each of the plurality of nanoholes are substantially perpendicular to the first surface. In yet another example, each of the plurality of nanowires corresponds to a cross-sectional area associated with a distance across less than 250 nm. In yet another example, the cross-sectional area is substantially uniform along a longitudinal direction for each of the plurality of nanowires. In yet another example, the plurality of nanowires includes a first nanowire and a second nanowire, the first nanowire and the second nanowire are separated by a second distance less than 1000 nm. In yet another example, each of the plurality of nanowires is separated from another nanowire selected from the plurality of nanowires by a second distance less than 1000 nm. In yet another example, each of the plurality of nanowires includes a semiconductor material. In yet another example, the semiconductor material is silicon.

According to yet another embodiment, an array of nanostructures includes a plurality of nanostructures. Each of the plurality of nanostructures includes a first end at a first surface and a second end. The first end and the second end are separated by a first distance of at least 200 μm. The plurality of nanostructures corresponds to a first area on the first surface. All nanostructures of the plurality of nanostructures are substantially parallel to each other. Each of the plurality of nanostructures includes a semiconductor material. For example, the array of nanostructures is implemented according to at least FIG. 1A, FIG. 1B, FIG. 2A, FIG. 2B, and/or FIG. 9.

In another example, the plurality of nanostructures is a part of a thermoelectric device. In yet another example, the semiconductor material is silicon. In yet another example, the first distance is at least 300 µm. In yet another example, the first distance is at least 400 µm. In yet another example, the first distance is at least 500 µm. In yet another example, the first distance is at least 525 µm. In yet another example, the first area is at least 100 mm$^2$ in size. In yet another example, the first area is at least 1000 mm$^2$ in size. In yet another example, the first area is at least 2500 mm$^2$ in size. In yet another example, the first area is at least 5000 mm$^2$ in size. In yet another example, the plurality of nanostructures are substantially perpendicular to the first surface.

In yet another example, each of the plurality of nanostructures corresponds to a plurality of nanoholes respectively. In yet another example, each of the plurality of nanoholes corresponds to a cross-sectional area associated with a distance across less than 250 nm. In yet another example, the cross-sectional area is substantially uniform along a longitudinal direction for each of the plurality of nanoholes. In yet another example, the plurality of nanostructures includes a first nanostructure and a second nanostructure, the first nanostructure and the second nanostructure are separated by a second distance less than 1000 nm. In yet another example, each of the plurality of nanostructures is separated from another nanostructure selected from the plurality of nanostructures by a second distance less than 1000 nm.

According to yet another embodiment, the method for forming an array of nanowires includes: providing a semiconductor substrate including a first surface and one or more second surfaces; masking at least one or more portions of the one or more second surfaces with at least a first portion of the first surface being exposed; applying a metalized film to at least the exposed first portion of the first surface; etching the semiconductor substrate through at least the exposed first portion of the first surface using a first etchant solution; and forming a first plurality of nanowires. Each of the first plurality of nanowires includes a first end (e.g., the end 150) at a third surface and a second end (e.g., the end 140). The first end and the second end are separated by a first distance of at least 200 µm. The first plurality of nanowires corresponds to a first area on the first surface. The first area on the first surface substantially corresponds to the exposed first portion of the first surface. All nanowires of the first plurality of nanowires are substantially parallel to each other. For example, the method is implemented according to at least FIG. 3.

In another example, the semiconductor substrate includes silicon. In yet another example, the process for masking at least one or more portions of the one or more second surfaces includes applying one or more masking materials to the one or more second surfaces. In yet another example, the one or more masking materials are selected from a group consisting of tape, nail polish, photo resist, Si$_3$N$_4$, SiC, DLC, Al, Ti, Ni, Au, Ag, Cr, ITO, Fe, Pt, and Mo. In yet another example, the metalized film includes one or more metals selected from a group consisting of Ag, Au, Pt, Pd, Ni, and Cu. In yet another example, the first etchant solution includes one or more oxidizing agents. In yet another example, the one or more oxidizing agents are selected from a group consisting of AgNO$_3$, KNO$_3$, NaNO$_3$, Fe(NO$_3$)$_3$, H$_2$O$_2$, Ag$_2$CrO$_4$, HNO$_3$, and KMnO$_4$.

In yet another example, the method further includes etching the semiconductor substrate through at least the exposed portion of the first surface using a second etchant solution, the second etchant solution is different from the first etchant solution. In yet another example, the method further includes washing the semiconductor substrate. In yet another example, the method further includes cleaning the semiconductor substrate after the process for forming a first plurality of nanowires. In yet another example, the method further includes drying the semiconductor substrate after the process for framing a first plurality of nanowires. In yet another example, the semiconductor substrate includes a fourth surface opposite to the first surface and the process for masking at least one or more portions of the one or more second surfaces includes keeping at least a second portion of the fourth surface exposed. In yet another example, the method further includes applying the metalized film to at least the exposed second portion of the fourth surface, etching the semiconductor substrate through at least the exposed second portion of the fourth surface using the first etchant solution, and forming a second plurality of nanowires, each of the second plurality of nanowires including a third end at a fifth surface and a fourth end. The fifth surface is different from the third surface.

Although specific embodiments of the present invention have been described, it will be understood by those of skill in the art that there are other embodiments that are equivalent to the described embodiments. For example, various embodiments and/or examples of the present invention can be combined. Accordingly, it is to be understood that the invention is not to be limited by the specific illustrated embodiments, but only by the scope of the appended claims.

What is claimed is:

1. A method for forming an array of nanowires, the method comprising:
   providing a semiconductor substrate including a first surface and one or more second surfaces;
   masking at least one or more portions of the one or more second surfaces with at least a first portion of the first surface being exposed;
   applying a metalized film to at least the exposed first portion of the first surface;
   etching the semiconductor substrate through at least the exposed first portion of the first surface using a first etchant solution; and
   forming a first plurality of nanowires, each of the first plurality of nanowires including a first end at a third surface and a second end, the first end and the second end being separated by a first distance of at least 200 µm;
   wherein:
   the first plurality of nanowires corresponds to a first area on the first surface;
   the first area on the first surface substantially corresponds to the exposed first portion of the first surface; and
   all nanowires of the first plurality of nanowires are substantially parallel to each other.

2. The method of claim 1 wherein the semiconductor substrate includes silicon.

3. The method of claim 1 wherein the process for masking at least one or more portions of the one or more second surfaces includes applying one or more masking materials to the one or more second surfaces.

4. The method of claim 3 wherein the one or more masking materials are selected from a group consisting of tape, nail polish, photo resist, $Si_3N_4$, SiC, DLC, Al, Ti, Ni, Au, Ag, Cr, ITO, Fe, Pt, and Mo.

5. The method of claim 1 wherein the metalized film includes one or more metals selected from a group consisting of Ag, Au, Pt, Pd, Ni, and Cu.

6. The method of claim 1 wherein the first etchant solution includes one or more oxidizing agents.

7. The method of claim 6 wherein the one or more oxidizing agents are selected from a group consisting of $AgNO_3$, $KNO_3$, $NaNO_3$, $Fe(NO_3)_3$, $H_2O_2$, $Ag_2CrO_4$, $HNO_3$, and $KMnO_4$.

8. The method of claim 1, and further comprising etching the semiconductor substrate through at least the exposed portion of the first surface using a second etchant solution, the second etchant solution being different from the first etchant solution.

9. The method of claim 1, and further comprising washing the semiconductor substrate.

10. The method of claim 1, and further comprising, after the process for forming a first plurality of nanowires, cleaning the semiconductor substrate.

11. The method of claim 1, and further comprising, after the process for forming a first plurality of nanowires, drying the semiconductor substrate.

12. The method of claim 1 wherein:
the semiconductor substrate includes a fourth surface opposite to the first surface; and
the process for masking at least one or more portions of the one or more second surfaces includes keeping at least a second portion of the fourth surface exposed.

13. The method of claim 12, and further comprising:
applying the metalized film to at least the exposed second portion of the fourth surface;
etching the semiconductor substrate through at least the exposed second portion of the fourth surface using the first etchant solution; and
forming a second plurality of nanowires, each of the second plurality of nanowires including a third end at a fifth surface and a fourth end, the fifth surface being different from the third surface.

14. A method for forming an array of nanowires, comprising:
providing a semiconductor substrate comprising a first surface and a second surface;
masking the second surface;
applying a metalized film to the first surface; and
etching the semiconductor substrate through the first surface using an etchant to form a plurality of nanowires, wherein each nanowire of the plurality of nanowires comprises a first end and a second end, wherein the first end and the second end of each nanowire are separated by a distance greater than 200 µm, and wherein a first nanowire of the plurality of nanowires and a second nanowire of the plurality of nanowires are substantially parallel to each other.

15. The method of claim 14, wherein the semiconductor substrate comprises silicon.

16. The method of claim 14, wherein the plurality of nanowires comprises silicon.

17. The method of claim 14, wherein the first end and the second end are separated by a distance greater than 300 µm.

18. The method of claim 14, wherein the first end and the second end are separated by a distance greater than 400 µm.

19. The method of claim 14, wherein the first end and the second end are separated by a distance greater than 500 µm.

20. A method for producing a thermoelectric device, comprising forming an array of nanowires, wherein forming the array of nanowires comprises:
providing a semiconductor substrate comprising a first surface and a second surface, wherein the semiconductor substrate comprises silicon;
masking the second surface;
applying a metalized film to the first surface; and
etching the semiconductor substrate through the first surface using an etchant to form a plurality of nanowires, wherein each nanowire of the plurality of nanowires comprises a first end and a second end, wherein the first end and the second end of each nanowire are separated by a distance greater than 200 µm, and wherein the plurality of nanowires are parallel to each other.

* * * * *